(12) United States Patent
Terauchi

(10) Patent No.: US 7,136,771 B2
(45) Date of Patent: Nov. 14, 2006

(54) SEMICONDUCTOR DEVICE AND TESTING CIRCUIT WHICH CAN CARRIES OUT A VERIFYING TEST EFFECTIVELY FOR NON-VOLATILE MEMORY CELLS

(75) Inventor: Youji Terauchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 125 days.

(21) Appl. No.: 10/765,844

(22) Filed: Jan. 29, 2004

(65) Prior Publication Data
US 2005/0114063 A1 May 26, 2005

(30) Foreign Application Priority Data
Jan. 29, 2003 (JP) ............................. 2003-021082

(51) Int. Cl.
*G06F 19/00* (2006.01)
(52) U.S. Cl. ...................... 702/117; 327/40; 714/719; 324/765
(58) Field of Classification Search ................ 702/117; 327/40; 714/719
See application file for complete search history.

(56) References Cited

U.S. PATENT DOCUMENTS

| | | | | |
|---|---|---|---|---|
| 6,094,735 A | * | 7/2000 | Cole et al. ................... | 714/724 |
| 6,182,255 B1 | * | 1/2001 | Ohtomo ...................... | 714/724 |
| 6,636,998 B1 | * | 10/2003 | Lee et al. ................... | 714/735 |
| 6,856,158 B1 | * | 2/2005 | Frame et al. ................ | 324/765 |
| 6,978,405 B1 | * | 12/2005 | Sellmair ..................... | 714/718 |

FOREIGN PATENT DOCUMENTS

JP      2001-155500      6/2001

* cited by examiner

*Primary Examiner*—Carol S. W. Tsai
(74) *Attorney, Agent, or Firm*—Young & Thompson

(57) ABSTRACT

A testing circuit includes m block test units and a first logical processing unit. The block test unit compares a first data outputted from a test object with a reference data, and outputs a result as a test circuit output signal based on a output control signal. The first logical processing unit judges whether the all of the m test circuit output signals indicate that the first data is coincident with the reference data, and outputs a result as a total judgment result signal based on the m test circuit output signals. The block test unit includes a block judging unit and a block output selecting unit. The block judging unit compares the first data with the reference data to judge whether the first data is coincident with the reference data, and outputs a result as a block judgment result signal.

8 Claims, 17 Drawing Sheets

| | | FIRST SECOND | OUTPUT OF DECODE CIRCUIT | | | |
|---|---|---|---|---|---|---|
| | | | CE3 | CE2 | CE1 | SECOND ADDRESS |
| MEMORY MACRO 10_3 | FINAL ADDRESS | 2FFFFh ⌇ 10000h | 1 | 0 | 0 | 1FFFFh ⌇ 00000h |
| | START ADDRESS | | | | | |
| MEMORY MACRO 10_2 | FINAL ADDRESS | 0FFFFh ⌇ 01000h | 0 | 1 | 0 | 0EFFFh ⌇ 00000h |
| | START ADDRESS | | | | | |
| MEMORY MACRO 10_1 | FINAL ADDRESS | 00FFFh ⌇ 00000h | 0 | 0 | 1 | 00FFFh ⌇ 00000h |
| | START ADDRESS | | | | | |

Fig. 10A

ADDRESS

- 20000h (1FFFFh)
- 0F000h (0EFFFh)
- 01000h (00FFFh)
- 00000h

MEMORY MACRO 10_1: 4Kbyte
MEMORY MACRO 10_2: 60Kbyte
MEMORY MACRO 10_3: 128Kbyte

Fig. 10B

| ADDRESS | 00000h ~00FFFh | 01000h ~0EFFFh | 0F000h ~1FFFFh |
|---|---|---|---|
| TCES4_1 | 1 | 0 | 0 |
| TCES4_2 | 1 | 1 | 0 |
| TCES4_3 | 1 | 1 | 1 |

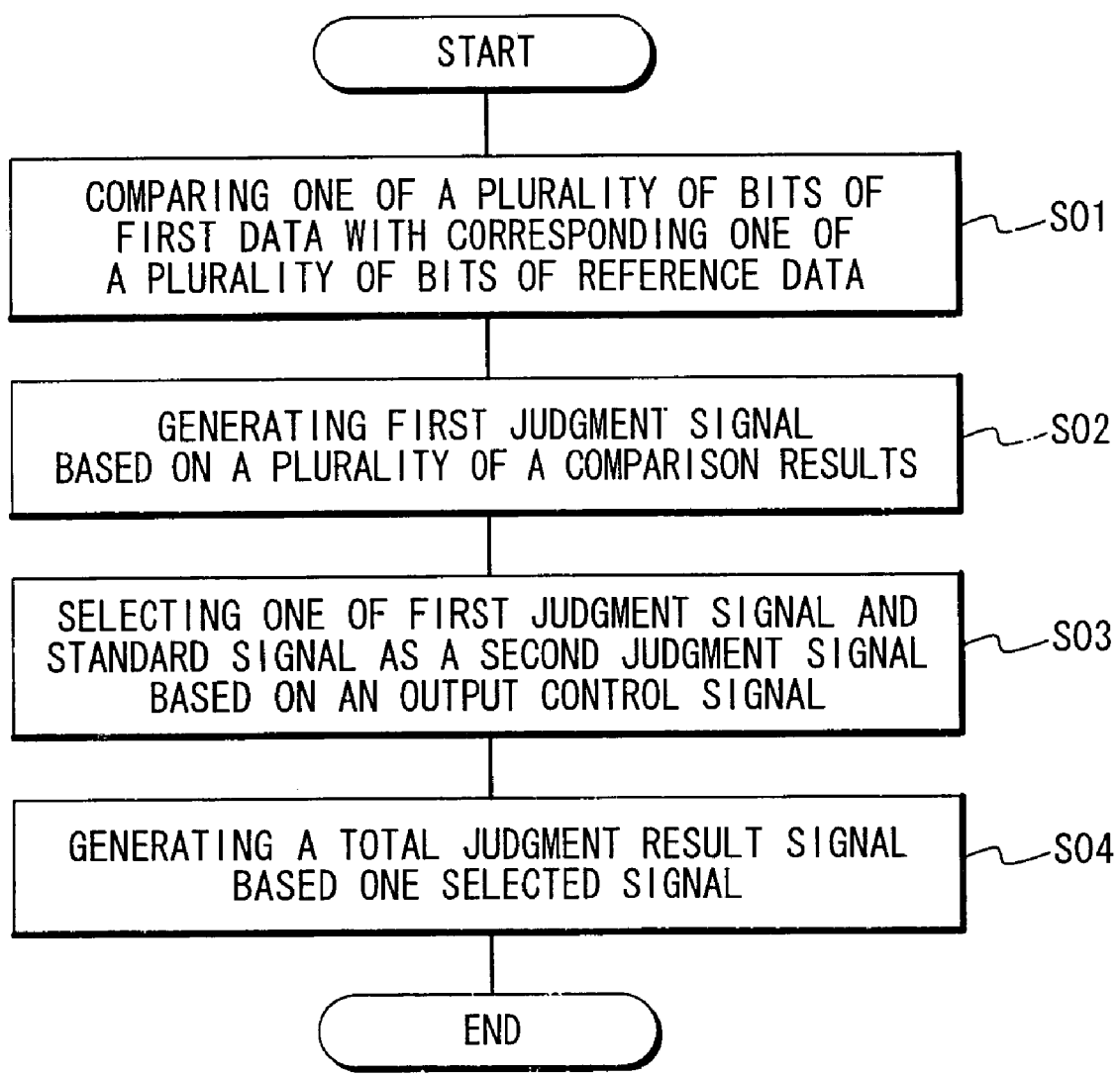

SEMICONDUCTOR DEVICE AND TESTING CIRCUIT WHICH CAN CARRIES OUT A VERIFYING TEST EFFECTIVELY FOR NON-VOLATILE MEMORY CELLS

BACKGROUND OF THE INVENTION

1. Field of the Invention

The present invention relates to a semiconductor device (hereafter, referred to as LSI) including a plurality of non-volatile memory macros. More particularly, the present invention relates to the LSI having a testing unit for effectively carrying out a verification (hereafter, referred to as verifying test) of an erasing operation and a writing operation of a non-volatile memory cell, which constitutes the memory macro and in which electrical erasing and writing are possible.

2. Description of the Related Art

At first, a memory cell of a non-volatile semiconductor memory device (Electrically Erasable and Programmable Read Only Memory; EEPROM), in which the electrical erasing and writing are possible, will be schematically described below. As is well known, the non-volatile memory cell includes a gate insulation film, a floating gate and a control gate on a semiconductor substrate. Under a condition that negative charges are not accumulated in the floating gate, if a positive voltage is applied to the control gate, a memory cell transistor is turned on. On the other hand, under a condition that negative charges are accumulated in the floating gate by injecting electrons therein, even if the positive voltage is applied to the control gate electrode, the memory cell is not immediately turned on. It is because the negative charges accumulated in the floating gate disable a channel to be immediately induced between a source and a drain. By further increasing the voltage applied to the control gate electrode and making it higher than a threshold voltage, the memory cell is turned on.

FIG. 1 is a diagram showing the typical example of the configuration of EEPROM of a collectively erasing type (also referred to as flash memory). With reference to FIG. 1, a memory cell array is composed of the plurality of memory cells MC which are arrayed in a shape of a matrix. The memory cell MC is a non-volatile memory cell. This memory cell array includes a plurality of word lines 508, a plurality of bit lines 509 and a plurality of source lines 510. Control gates of the memory cells on the same column are commonly connected to the word line 508. Drains of the memory cells on the same row are commonly connected to the bit line 509. Sources of the memory cells on the same column are commonly connected to the source line 510. The plurality of source lines 510 are commonly connected to each other, which is referred to as common source line 510. Incidentally, the following configuration of the memory cell array is used in many cases. The configuration is that the memory cell array is divided into a plurality of sectors, the sources of the plurality of memory cells within the same sector are connected to the common source line, and the collective erasing is performed on the sector unit.

The word lines 508 are connected to an X decoder 511, and the bit lines 509 are connected to an Y decoder 512.

The plurality of source lines 510, to which the sources of the respective memory cells are connected, are commonly connected and connected to a switching circuit 513. This switching circuit 513 connects them to a ground potential at the times of the reading and writing operations of the memory cell. It connects them to an erasing voltage generating circuit 514 at the time of the erasing operation of the memory cell.

Also, it includes a reading control circuit 515, a writing control circuit 516 and an erasing control circuit 517. The reading control circuit 515 is for carrying out a reading operation control of the memory cell. The writing control circuit 516 is for carrying out a writing control to the memory cell. The erasing control circuit 517 is for carrying out an erasing operation control of the memory cell. Respective control output signals from the reading control circuit 515, the writing control circuit 516 and the erasing control circuit 517 are sent to the X decoder 511 and the Y decoder 512, respectively.

FIGS. 2A and 2B are flowcharts showing an example of a procedure for a writing verification and an erasing verification of the flash memory. The operation of the conventional flash memory will be described below with reference to FIG. 1, FIGS. 2A and 2B.

When data is written to the memory cell, the common source line 510 is connected through the switching circuit 513 to the ground potential, thereby applying the ground potential to the source of the memory cell. Then, actuating the writing control circuit 516, a bit line selected by the Y decoder 512 is set at a high voltage, thereby applying the high voltage to the drain of the memory cell connected to the bit line. Also, a word line selected by the X decoder 511 is set at a high potential, thereby setting the control gate of the memory cell at a high voltage (for example, 12 V). Then, in the selected memory cell, hot electrons generated near the drain are injected into the floating gate (step S101–102 in FIG. 2A).

After that, as the procedure is shown in FIG. 2A, the writing state is set off (step S103), and the writing verifying operation is then started (step S104). That is, the data is read out from the memory cell corresponding to the writing address of the device (Step S105). Whether or not this read out data coincides with a certain writing data is verified (step S106). If the certain data is written (step S106: Yes) in the memory, the writing operation is ended. If the certain data is not written (step S106: No), the procedure returns back to the step S101, and the data is again written to the memory cell corresponding the same address.

When the data is read out, the common source line 510 is connected to the ground potential similarly to the time of the writing. Then, actuating the reading control circuit 515, the Y decoder 512 and the X decoder 511 set the bit line 509 and the word line 508 at the predetermined voltages, respectively. This sets the predetermined voltages for the gate and the drain of the memory cell, thereby reading out the data in the selected memory cell. At this time, the magnitude of the current flowing through the bit line 509 connected to the selected memory cell is detected by a sense amplifier (not shown). Consequently, "1" or "0" of the data stored in the selected memory cell is judged (in the following explanation, "1" and "0" indicate logical values, respectively).

Also, when the data is erased from the memory cell, the common source line 510 is connected through the switching circuit 513 to the erasing voltage generating circuit 514. Then, actuating the erasing control circuit 517, thereby the common source line 510 is set at a high potential (for example, 12 V). The sources of the memory cells are set at high potentials, all of the word lines 508 are set at the ground potential, all of the bit lines are set at open states, the drains of the memory cells are made open, and the collective erasing operation is performed on all of the memory cells (or the sector units) (Step S202). At this time, a strong electric field is generated between the source and the floating gate of the memory cell, and the electrons in the floating gate are pulled into the source side by the tunnel phenomenon.

In the flash memory, prior to the actual erasing operation, the writing operation of all the bits to be collectively erased are carried out in advance (at a step S201 of FIG. 2B) in order to make the thresholds of all the memory cells targeted for the collective erasing approximately equal to each other, typically. After that, so as not to bring about the over-erasing of the memory cell, the erasing verification is done in each of predetermined times, which the erasing time is finely divided into. In each of predetermined time unit, the erasing operation and then checking the thresholds of all the memory cells are carried out, little by little. Then, if a proper threshold is obtained, the erasing operation is stopped. That is, at an erasing state check mode, the data is read out from the device (Step S205), and whether or not the data is erased is verified (Step S206). If it is not erased, the erasing operation is again done only for a predetermined time (Step S202). On the other hand, if it is erased, whether or not an address on which the check for the erasing state is performed is a final address is checked. If it is not the final address, the procedure proceeds to a next address (Step S208), and the erasing state of the memory cell of the address is checked. On the other hand, if it is the final address, the erasing operation is completed.

If the erasing time becomes a certain value or more, a threshold voltage of the memory cell, which is, for example, written at a threshold voltage of about 5 V at an initial state, becomes negative. This memory cell is at a depression state at which it is turned on even if its gate potential is the ground potential. If the over-erasing condition is induced, a right data can not be read out. For example, in the memory cell array shown in FIG. 1, under the situation that a memory cell H is in the over-erasing condition, if a data is written to a memory cell J and this data is further read out, a current does not flow between a drain and a source in the selected memory cell J. However, a current flows between a drain and a source in the non-selected memory cell H. For this reason, a current flows through a bit line B1, and the sense amplifier detects the memory cell J, which is an off bit, as the on bit. Thus, in order to avoid such over erasing condition from being induced, the procedure for repeating the collective erasing operation at the predetermined time unit and the erasing verification for each address after that is carried out as mentioned above. The erasing verification requires a very long time as compared with the reading out operation and the writing verification.

That is, in the conventional flash memory, the operational time is long in the order of the reading out operation, the writing operation including the verification and the erasing operation including the verification. For example, the reading out operation requires the time of the order of 100 ns (nano-seconds). The writing operation including the verification requires the time of the order of several ten is (micro seconds). The erasing operation including the verification requires the time of the order of several hundred ms (mili-seconds). For this reason, in association with the increase in a memory capacity, the test time involving the verifying operation becomes longer.

The LSI, such as a micro processor which includes the non-volatile memory such as the flash memory and the like and CPU (Central Processing Unit) on the same substrate, is given to a user in the shape that the non-volatile memory is divided into a plurality of memory blocks (memory macros). This is for treating with the increase in a necessary memory capacity and the various applications on the user side. The non-volatile memory built in a microcomputer typically stores therein a program to be executed in the CPU and data and the like. For example, it is designed such that the manufacturing side preliminarily prepares four memory blocks (the maximum of 4 M bits), each having 8 bits×128 K (=1 M bits). The configuration of the usage memory blocks can be varied in response to the application on the user side. This reason is as follows. That is, in association with the increase in the memory capacity, if one memory cell array is composed of many memory cells which have large capacity, for example, the increase in the number of cell transistors, in which each drain is connected to one bit line, increases the load. Moreover, in association with the increases in a wire resistance and a wire capacitance, it is difficult to uniformly transmit a signal from one end of the bit line to a cell transistor located at another end. That is, the non-volatile memory is divided in advance into the plurality of memory blocks, and the memory blocks are used corresponding to the necessary capacity. This realizes the large memory capacity and a high speed access simultaneously.

Incidentally, if the LSI having the plurality of non-volatile memory blocks is designed so as to output in parallel the output data of the respective memory blocks in their original states from test terminals to outside, the number of the output terminals dedicated to the test which are mounted on the LSI is increased proportionally to the number of the memory blocks. Thus, this is inefficient and uneconomical. In particular, in the case of the multiple-bit structure in which the non-volatile memory block has 4 bits, 8 bits and the like, the number of the output terminals dedicated to the test is increased. Hence, the structure in which the output data of the respective memory blocks are outputted in their original states and in parallel from the terminals for the test to the outside is not actually used from the viewpoints of the restriction on the number of the terminals and the cost.

Conventionally, for example, the LSI, which includes the plurality of non-volatile memory blocks in the multiple-bit structure as mentioned above, uses the structure shown in FIG. 3.

FIG. 3 is a view showing an example of a configuration of a conventional microprocessor. This microprocessor 600 has a plurality of memory blocks of a flash type EEPROM on the same substrate. With reference to FIG. 3, this microprocessor 600 includes memory blocks 601_1 to 601_3 composed of flash memories with the multiple-bit structure of the same bit width (n-bit width; n is an integer of 2 or more). It also includes a selector 604 whose inputs are connected to data buses 603_1 to 603_3 to transfer output data from the memory blocks 601_1 to 601_3. The output data (n bits) of the memory block selected by the selector 604 is outputted to a data output terminal 605.

When the writing verifying or erasing verifying test is executed, an address signal sent by an automatically testing apparatus (not shown) is sent as a read address from an address bus 602 to the memory blocks 601_1 to 601_3. The output data from the memory block selected by the selector 604 is outputted to the data output terminal 605, and the output data is sent to a comparator of a pin electronics card of the automatically testing apparatus (not shown). A selection signal for controlling the selection of the selector 604 is sent by the automatically testing apparatus (not shown). On the other hand, at a time of a usual operation, the data read out from the memory blocks 601_1 to 601_3 on the basis of the read address from CPU (not shown) is sent as a read data to the CPU. The data output terminal 605 is an outer terminal dedicated to the test, and the number of the data output terminals 605 corresponds to the bit width of the output data of the memory block.

However, such as this LSI, the configuration, in which the terminal number of the outer terminals dedicated to the test is limited by the mechanism that the output data from the plurality of non-volatile memory blocks are selected by the selector and outputted from the output terminals, has the problem of the remarkable increase in the test time of the LSI including the non-volatile memory blocks, as a result.

FIG. 4 is a flowchart showing an example of a test sequence usually carried out in the test of the flash memory. In this case, at first, a test 1 carries out the erasing operation and the erasing verification (Steps S301, S302). At this time, if the erasing verification is impossible (failed), the erasing operation is again carried out as mentioned above.

If the erasing verification is passed, a test 2 carries out the writing operation of a checker pattern and the writing verification (Steps S303, S304).

If the writing verification is passed, a test 3 carries out the erasing operation and the erasing verification (Steps S305, S306).

Next, a test 4 carries out the writing operation of a checker bar pattern and the writing verification (Steps S307, S308). If the writing verification is passed, a test 5 again carries out the erasing operation and the erasing verification (Steps S309, S310).

Next, a test 6 carries out the writing operation of all "0" data and the writing verification (Steps S311, S312).

Then, after a test 7 carries out a burn-in (wafer baking), the writing verification is again carried out (Steps S313, S314). Again, a test 8 carries out the erasing operation and the erasing verification (Steps S315, S316).

If the test composed of the test sequences as mentioned above is executed to the LSI shown in FIG. 3 as the device to be tested, since the LSI is designed that the output data selected by the selector 604 among the memory blocks 601_1 to 601_3 is outputted from the data output terminal 605, the verifying operations can not be performed in parallel between the memory blocks 601_1 to 601_3. That is, because of the restriction on the number of the terminals, it is designed such that the output data of the memory block is selected by the selector 604 and outputted to the outer terminal. Hence, when the data necessary for the verifying operation is read out, the read data of the plurality of memory blocks can not be outputted to the outside at the same time.

For this reason, when the verifying test is carried out at the testing step of the conventional LSI, the selector 604 sequentially switches the output data of the memory blocks 601_1 to 601_3, and outputs to the data output terminal 605. Then, the comparator of the automatically testing apparatus compares it with an expectation value, thereby judging a pass or a failure. In association with the increase in the memory capacity of the memory blocks built in the LSI and the increase in the number of the memory cell blocks, the verification test time is increased.

As the means to solve the above-mentioned problems, the inventor of the present invention proposes LSI in Japanese Laid Open Patent Application (JP-A 2001-155500). It is possible for the proposed LSI to shorten the test time for the verifying test and the like, while suppressing the increase in the number of the terminals dedicated to the test, even in the LSI having the plurality of non-volatile memory macros.

FIG. 5A is a view showing the schematic configuration of one example of the LSI disclosed in the above-mentioned patent application. With reference to FIG. 5A, an LSI 700 includes flash memory blocks (hereafter, referred to as memory macro) 701_1 to 701_3, an address bus 702, output data buses 703_1 to 703_3, verifying circuits 705_1 to 705_3, verification result output terminals 706_1 to 706_3, expectation value data input terminal 707, an address bus 708, a data bus 709, selectors 710, 712 and 713, an address input terminal 714, a data input terminal 715 and a CPU 720.

The flash memory blocks 701_1 to 701_3 are three non-volatile memory blocks, and output data from the respective memory blocks 701_1 to 701_3 are outputted to output data buses 703_1 to 703_3, respectively. These data are inputted to verifying circuits 705_1 to 705_3, respectively. Data of plural (n-) bit width are outputted as read data from the respective memory blocks 701_1 to 701_3, and the output data buses 703_1 to 703_3 are defined as the n-bit width.

FIG. 5B is a view showing the schematic configuration of the verifying circuits disclosed in the above-mentioned patent application. Each of the verifying circuits 705_1 to 705_3 includes: n exclusive logical sum gates EXOR_1 to EXOR_n and a logical sum gate OR. Each of the n exclusive logical sum gates EXOR_1 to EXOR_n compares each bit data of the output data buses 703_1 to 703_3 of the n-bit width with each bit data of an expectation value data 704 of the n-bit width input from an expectation value data input terminal 707. Then, it judges whether or not they are coincident with each other. The logical sum gate OR carries out the logical sum between the outputs of the n exclusive logical sum gates EXOR_1 to EXOR_n. Then, it outputs verification result judgment signals to verification result output terminals 706_1 to 706_3. In the LSI 700, the verification result output terminals 706_1 to 706_3 are placed correspondingly to the number of the memory blocks 701_1 to 701_3, and the verification result judgment signals from the respective verifying circuits 705_1 to 705_3 are outputted to the automatically testing apparatus (not shown), in parallel to each other.

When the LSI 700 is tested, the writing verification and erasing verification tests are carried out in parallel in the three memory blocks 701_1 to 701_3. That is, the same read address is sent from the side of the automatically testing apparatus (not shown) to the three memory blocks 701_1 to 701_3. Each of the verifying circuits 705_1 to 705_3 compares the read data outputted from each of the memory blocks 701_1 to 701_3 with the expectation value data sent to the expectation value data input terminal 107 from the automatically testing apparatus (not shown), every bit unit. Then, if there is the bit data that does not coincide with the expectation value data, namely, if the output signal from any one of the exclusive logical sum gates EXOR is "1", the verification result judgment signal outputted from the logical sum gate OR is "1". Consequently, the LSI 700 itself can carry out the verification. The comparator of the automatically testing apparatus (not shown) is connected to the verification result output terminals 706_1 to 706_3. The automatically testing apparatus judges it as the pass if the verification result judgment signal from each of the verifying circuits 705_1 to 705_3 is "0", and judges it as the fail if it is "1".

Thus, for example, when each memory block has an 8-bit data output (the bit width of the data bus n=8), in order to make the speed of the verifying test faster, if the circuit is configured so as to output the data of the three memory blocks (the number of the memory blocks m=3) in parallel, this configuration requires 24 (=m×n) output terminals dedicated to the test. Moreover, this configuration requires 24 comparators of the automatically testing apparatus. However, according to the LSI 700, although the time necessary for the test is not changed, as the necessary output terminal dedicated to the test, it is enough to mount the three verification result output terminals 706_1 to 706_3 corresponding to the number (3) of the memory blocks. Thus, the number of the output terminals dedicated to the test is extremely reduced. Hence, the number of the comparators necessary for the verifying test may be three in the automatically testing apparatus.

As mentioned above, in the LSI based on the above patent application, while the time necessary for the writing verifying test and the erasing verifying test is kept equal to that in the case of the circuit configuration of outputting the data of each memory macro as all-bit parallel, the number of the output terminals dedicated to the test for the verifying test of each memory macro is greatly reduced to the number equal to the number of the memory macros built in the LSI.

However, in recent years, the number of the non-volatile memory macros built in the LSI has been increased, and the structure of the memory macro (the number of the memory cells included in one memory macro) has been diversified. In particular, the method of carrying out the plurality of memory macro verifying tests, in which memory sizes are different, in parallel at the same time, without any increase in the number of the terminals dedicated to the test is not attained up to the present. It is desired to further improve the efficiency of the verifying test of the memory macro whose structure is diversified, while suppressing the increase in the number of the terminals dedicated to the test.

SUMMARY OF THE INVENTION

Therefore, an object of the present invention is to provide a testing circuit that can further efficiently carry out the verifying test of a memory macro whose configuration is diversified, while suppressing the increase in the number of terminals dedicated to a test, for example, in LSI in which a plurality of non-volatile memory macros having various structures are built, and LSI in which such a testing circuit is built in. This and other objects, features and advantages of the present invention will be readily ascertained by referring to the following description and drawings.

Another object of the present invention is to provide a semiconductor device that includes the above-mentioned testing circuit.

In order to achieve an aspect of the present invention, the present invention provides a testing circuit comprising: m (m is an integer of 2 or more) block test units and a first logical processing unit. Each of m block test units compares a first data of n (n is a positive integer) bits with a reference data of said n bits for each corresponding bit, and outputs a comparison result as a test circuit output signal based on a output control signal. Said first data is outputted from corresponding one of m object circuits for a test. The first logical processing unit judges whether or not said all of m said test circuit output signals indicate that said first data is coincident with said reference data, and outputs a judgment result as a total judgment result signal based on said m test circuit output signals. Each of said m block test units includes: a block judging unit and a block output selecting unit. The block judging unit compares said first data with said reference data for each corresponding bit to judge whether said first data is coincident with said reference data, and outputs a comparison result as a block judgment result signal. The block output selecting unit outputs one of said block judgment result signal and a predetermined standard signal as said test circuit output signal based on said output control signal.

In the testing circuit of the present invention, said output control signal is set such that said block output selecting unit outputs one of said block judgment result signal and said standard signal, in reference to a test condition for said one of m object circuits when said first data is outputted.

In the testing circuit of the present invention, said block output selecting unit outputs said block judgment result signal when said test condition corresponds to said one of m object circuits. It outputs said standard signal when test condition does not correspond to said one of m object circuits, based on said output control signal.

In the testing circuit of the present invention, said standard signal is set as the same logical state of said block judgment result signal indicating that said first data is coincident with said reference data.

In the testing circuit of the present invention, said total judgment result signal indicates all of said m object circuits pass said test, in case that all of m said test circuit output signal indicate that said first data is coincident with said reference data.

In the testing circuit of the present invention, said total judgment result signal indicates at least one of said m object circuits fails said test, in case that at least one of m said test circuit output signal indicates that said first data is not coincident with said reference data.

In the testing circuit of the present invention, said block judging unit includes: n individually judging units and a second logical processing unit. Each of n individually judging units compares one of n bits of said first data with corresponding one of n bits of said reference data, and outputs a comparison result as a comparison result signal. The second logical processing unit outputs said block judgment result signal indicating whether or not said first data is coincident with said reference data, based on a plurality of said comparison result signals supplied from said n individually judging units.

In the testing circuit of the present invention, said block judgment result signal indicates that said first data is coincident with said reference data, in case that all of said comparison result signals indicate that said one of n bits of the first data is coincident with said corresponding one of n bits of the reference data.

In order to achieve another aspect of the present invention, the present invention provides a semiconductor device comprising: m (m is an integer of 2 or more) memory macros, a testing unit and a test output terminal. Each of m memory macros includes a plurality of non-volatile memory cells that are electrical erasable and writable. The testing unit carries out an erasing verifying test and a writing verifying test that are tests verifying of results of a erasing operation and a writing operation to said memory cell, respectively. The test output terminal outputs test results carried out by said testing unit to an outside. The memory size of at least one of said m memory macros is different from that of another, said memory size corresponds to a number of said memory cell. Said testing unit tests said m memory macros in parallel.

In the semiconductor device of the present invention, said testing unit includes: m comparison judging units, m first selecting units and a totally judging unit. Each of m comparison judging units is installed correspondingly to one of said memory macros. It compares a first data of a plurality of bits outputted from corresponding one of said memory macros with a reference data of said plurality of bits for each corresponding bit to judge whether said first data is coincident with said reference data, and outputs a comparison result as a first judgment signal. Each of m first selecting units is installed correspondingly to one of said comparison judging units. It outputs one of said first judgment signal and a predetermined standard signal as a second judgment signal based on an output control signal, said first judgment signal is supplied from corresponding one of said comparison judging units. The totally judging unit judges whether or not said all of m said second judgment signals indicate that said first data is coincident with said reference data, and outputs a judgment result as a total judgment result signal based on said m second judgment signals.

In the semiconductor device of the present invention, said output control signal is set based on whether or not a memory cell corresponding to an address exists in said memory macro. Said address is commonly supplied to said m memory macros as an address signal when one of said erasing verifying test and said writing verifying test is carried out to said memory macro.

In the semiconductor device of the present invention, said output control signal is set such that said first selecting unit outputs said first judgment signal when said memory cell corresponding to said address exists in said memory macro.

In the semiconductor device of the present invention, said standard signal is set as the same logical state of said first judgment signal indicating that said first data is coincident with said reference data.

In the semiconductor device of the present invention, said total judgment result signal indicates all of said m memory macros pass said test, in case that all of m said second judgment signals indicate that said first data is coincident with said reference data.

In the semiconductor device of the present invention, said total judgment result signal indicates at least one of said m memory macros fails said test, in case that at least one of m said second judgment signals indicates that said first data is not coincident with said reference data.

In the semiconductor device of the present invention, said reference data indicates a data which includes at least pattern data corresponding to an erasing verifying test and a writing verifying test, respectively.

The semiconductor device of the present invention, further includes a memory unit which stores data of a plurality of said reference data and outputs one of said reference data when one of said erasing verifying test and said writing verifying test is executed.

The semiconductor device of the present invention, further includes a second selecting unit which selects said reference data from said plurality of reference data in said memory unit, corresponding to a type of a verifying test to be executed, and outputs said reference data to said each of m comparison judging units.

In the semiconductor device of the present invention, said comparison judging unit includes: a plurality of coincident judging units and a logical unit. Each of the plurality of coincident judging units compares one of said plurality of bits of said first data with corresponding one of said plurality of bits of said reference data, and outputs a comparison result. The logical unit outputs said first judgment signal indicating whether or not said first data is coincident with said reference data based on a plurality of said comparison results supplied from said plurality of coincident judging units.

In the semiconductor device of the present invention, said first judgment signal indicates that said first data is coincident with said reference data, in case that all of said comparison results of said plurality of coincident judging units indicate that said one of the plurality of bits of the first data is coincident with said corresponding one of the plurality of bits of the reference data.

The semiconductor device of the present invention, further comprises a CPU, a testing address input terminal, a third selecting unit and a decoder unit. The third selecting unit selectively outputs a CPU address signal supplied from said CPU at the time of usual operations or a testing address signal supplied through said testing address input terminal at the time of verifying tests as a first address signal, based on a test mode signal that is activated at the time of said verifying tests. The decoder unit decodes said first address signal, and outputs a second address signal for said memory macro and said first enable signals that indicate which of said respective memory macros is an access target.

The semiconductor device of the present invention, further comprises a fourth selecting unit which selectively outputs a CPU data signal supplied from the CPU at the time of said usual operations or a testing data signal supplied through a testing data input terminal at the time of said verifying tests based on said test mode signal.

A semiconductor device of the present invention, comprises a first memory macro, a second memory macro, a first comparing unit, a second comparing unit and a gate unit. The first memory macro includes a first memory size. The second memory macro includes a second memory size larger than said first memory size. The first comparing unit outputs a first coincident signal in case that a first test data read out from said first memory macro is coincident with an first expectation data, and a first inconsistency signal in case that said first test data is not coincident with said first expectation data. The second comparing unit outputs a second coincident signal in case that a second test data read out from said second memory macro is coincident with a second expectation data, and a second inconsistency signal in case that said second test data is not coincident with said second expectation data. The gate unit outputs a third coincident signal in case when receiving said first coincident signal from said first comparing unit and said second coincident signal from second comparing unit.

In order to achieve still another aspect of the present invention, the present invention provides a testing method for a semiconductor device, comprising: supplying an address signal indicating an address to one of m (m is an integer of 2 or more) memory macros to obtain a first data stored in a memory cell corresponding to said address, wherein said address is commonly supplied to said m memory macros; comparing said first data of a plurality of bits outputted from said one of m memory macros with a reference data of said plurality of bits for each corresponding bit to judge whether said first data is coincident with said reference data, and generating a comparison result as a first judgment signal, for all said m memory macros; selecting one of said first judgment signal and a predetermined standard signal as a second judgment signal based on an output control signal, for said all m memory macros; judging whether or not said all of m said second judgment signals indicate that said first data is coincident with said reference data; and generating a total judgment result signal which indicates a judgment result. Said output control signal is set based on whether or not said memory cell corresponding to said address exists in said one of m memory macros.

In the testing method for a semiconductor device of the present invention, said output control signal is set such that said first judgment signal is selected when said memory cell corresponding to said address exists in said one of m memory macros.

In the testing method for a semiconductor device of the present invention, said standard signal is set as the same logical state of said first judgment signal indicating that said first data is coincident with said reference data.

In the semiconductor device of the present invention, said total judgment result signal indicates all of said m memory macros pass said test, in case that all of m said second judgment signals indicate that said first data is coincident with said reference data.

In the semiconductor device of the present invention, said total judgment result signal indicates at least one of said m memory macros fails said test, in case that at least one of m said second judgment signals indicates that said first data is not coincident with said reference data.

In the testing method for a semiconductor device of the present invention, said comparing step includes: comparing one of said plurality of bits of said first data with corresponding one of said plurality of bits of said reference data; and generating said first judgment signal indicating whether or not said first data is coincident with said reference data based on a plurality of said comparison results.

In the testing method for a semiconductor device of the present invention, said first judgment signal indicates that said first data is coincident with said reference data, in case that all of said comparison results of said plurality of coincident judging units indicate that said one of the plurality of bits of the first data is coincident with said corresponding one of the plurality of bits of the reference data.

In order to achieve yet still another aspect of the present invention, the present invention provides a computer program product embodied on a computer-readable medium and comprising code that, when executed, causes a computer to perform the following: supplying an address signal indicating an address to one of m (m is an integer of 2 or more) memory macros to obtain a first data stored in a memory cell corresponding to said address, wherein said address is commonly supplied to said m memory macros; comparing said first data of a plurality of bits outputted from said one of m memory macros with a reference data of said plurality of bits for each corresponding bit to judge whether said first data is coincident with said reference data, and generating a comparison result as a first judgment signal, for all said m memory macros; selecting one of said first judgment signal and a predetermined standard signal as a second judgment signal based on an output control signal, for said all m memory macros; judging whether or not said all of m said second judgment signals indicate that said first data is coincident with said reference data; and generating a total judgment result signal which indicates a judgment result. Said output control signal is set based on whether or not said memory cell corresponding to said address exists in said one of m memory macros.

In the computer program product of the present invention, said output control signal is set such that said first judgment signal is selected when said memory cell corresponding to said address exists in said one of m memory macros.

In the computer program product of the present invention, said standard signal is set as the same logical state of said first judgment signal indicating that said first data is coincident with said reference data.

In the computer program product of the present invention, said total judgment result signal indicates all of said m memory macros pass said test, in case that all of m said second judgment signals indicate that said first data is coincident with said reference data.

In the computer program product of the present invention, said total judgment result signal indicates at least one of said m memory macros fails said test, in case that at least one of m said second judgment signals indicates that said first data is not coincident with said reference data.

In the computer program product of the present invention, said comparing step includes: comparing one of said plurality of bits of said first data with corresponding one of said plurality of bits of said reference data; and generating said first judgment signal indicating whether or not said first data is coincident with said reference data based on a plurality of said comparison results.

In the computer program product of the present invention, said first judgment signal indicates that said first data is coincident with said reference data, in case that all of said comparison results of said plurality of coincident judging units indicate that said one of the plurality of bits of the first data is coincident with said corresponding one of the plurality of bits of the reference data.

BRIEF DESCRIPTION OF THE DRAWINGS

FIG. 10A is a view showing the memory sizes of those memory macros;

FIG. 10B is a table showing the set state of the TCES 4 based on the verifying test target address;

FIG. 16 is a flowchart showing the operation of a verifying testing method of the present invention for a semiconductor device.

DESCRIPTION OF THE PREFERRED EMBODIMENTS

The present invention will be described below with reference to the attached drawings.

Figure 6A:
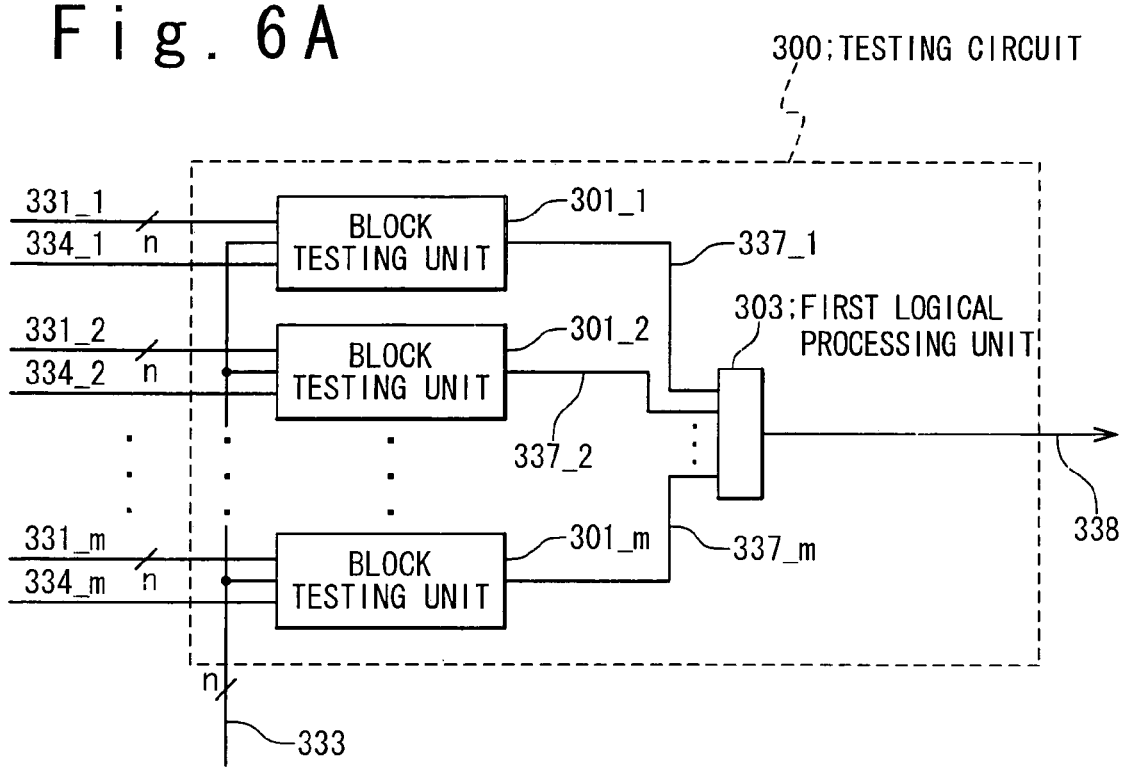
FIG. 6A is view showing the configuration of an embodiment of a testing circuit according to the present invention.
Figure 6B:
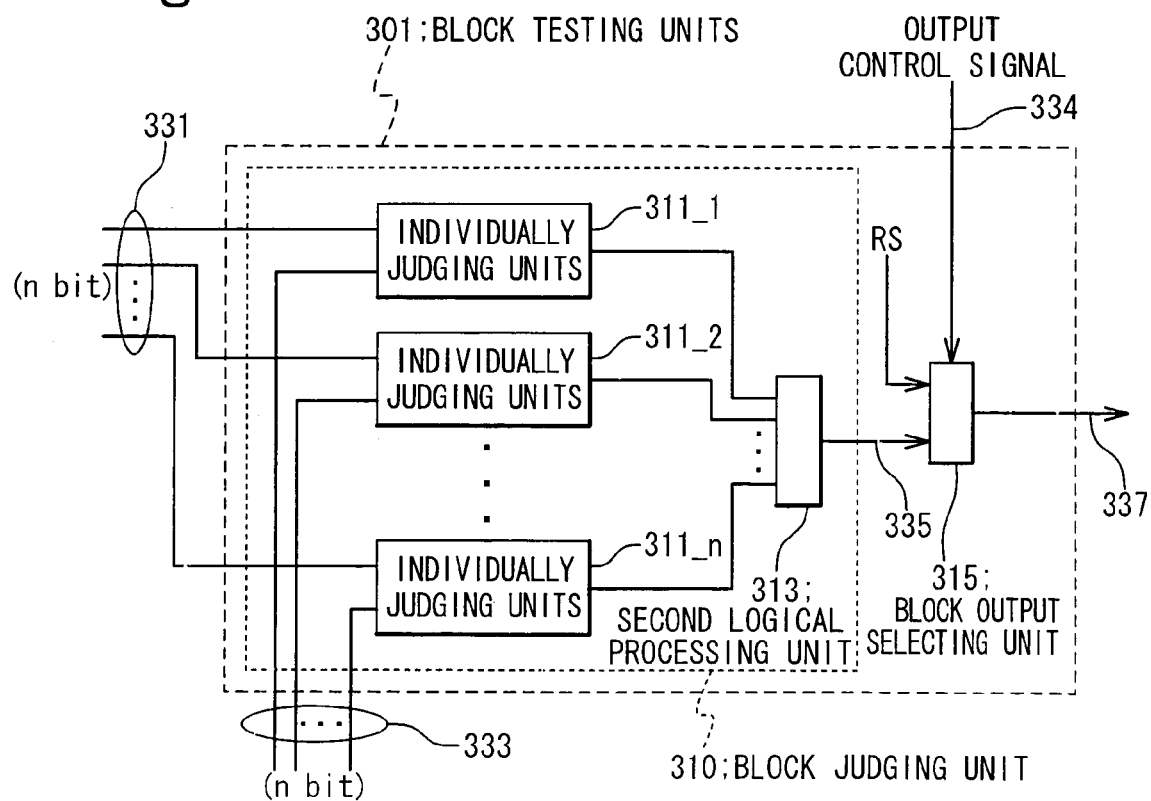
FIG. 6B is view showing the configuration of a block testing unit in FIG. 6A.

FIGS. 6A and 6B are views diagrammatically showing the configuration of an embodiment of a testing circuit according to the present invention. FIG. 6A is a schematic block diagram, and FIG. 6B is a detailed block diagram showing a block testing unit of FIG. 6A. With reference to FIG. 6A, the testing circuit 300 of this embodiment includes m (m is an integer of 2 or more) block testing units 301 and a first logical processing unit 303. Each of the block testing units 301 receives a first signal 331 of n bits (n is a positive integer), a reference signal 333 of n bits and a predetermined output control signal 334. Then, it judges whether or not the first signal 331 is coincident with the reference signal 333, for each corresponding bit. After that, it outputs a comparison result, which is controlled by an output control signal 334, as a test circuit output signal 337. The first logical processing unit 303 receives the m test circuit output signals 337 and outputs a total judgment result signal 338 indicative of a coincidence if all of the m test circuit output signals 337 indicate that the first signal 331 is coincident with the reference signal 333.

As shown in FIG. 6B, each of the block testing units 301 includes a block judging unit 310 and a block output selecting unit 315.

The block judging unit 310 receives the first signal 331 and the reference signal 333 and judges whether or not they are coincident with each other for each corresponding bit. Then, it outputs a block judgment result signal 335 indicative of the coincidence if all of them are coincident.

The block output selecting unit 315 receives the block judgment result signal 335 and a predetermined standard signal RS as a selected signal, and also receiving the output control signal 334 as a selecting signal. Then, it outputs the block judgment result signal 335 or the standard signal RS as the test circuit output signal 337 on the basis of the output control signal 334.

Moreover, the block judging unit 310 includes n individually judging units 311 and a second logical processing unit 313. Each of the individually judging units 311 receives one of bits of the first signal 331 and corresponding one of bits of the reference signal 333. Then, it judges whether or not they are coincident each other. The output signal indicating the judging result is outputted to the second logical processing unit 313. The second logical processing unit 313 receives all of the respective output signals of the n individually judging units 311 and outputting the block judgment result signal 335 indicative of the coincidence if all of them are coincident.

The standard signal RS is set as the signal indicative of the same logical state as the case when the block judgment result signal 335 indicates the coincidence.

Also, the output control signal 334 is set correspondingly to the first signal 331 and composed of m kinds of signals (331_1 to 331_m). The output control signal 334 is set such that the block output selecting unit 315 selects and outputs one of said block judgment result signal 335 and the standard signal RS, in reference to a test condition for an object circuit. Here, the object circuit is an object (a target) of the test carried out by this testing circuit. Each of the first signal 331_1 to 331_m is outputted from corresponding one of m object circuits. The block output selecting unit 315 outputs the block judgment result signal 335 when the test condition corresponds to the one of m object circuits, and outputs the standard signal RS when test condition does not correspond to the one of m object circuits (10), based on the output control signal 334. The test condition corresponds to the object circuit is a condition that it is suitable and available to test the the object circuit. In this condition, the object circuit can output the first signal 331 deserving of the evaluation. That is, any output control signal 334_j (j is an integer in a range of 1 to m) is set such that the block output selecting unit 315 selects a block judgment result signal 335_j when a first signal 331_j supplied to a block testing unit 301_j is the effective signal (deserving of the evaluation), and that it selects the standard signal RS when the first signal 331_j is the ineffective signal.

Thus, for example, under the n-bit structure, if the verifying tests are performed in parallel on a plurality (m) of non-volatile memory macros whose memory sizes are different, a test address signal is commonly sent to the respective memory macros. Thus, depending on the memory macro, there may be a case that the memory cell corresponding to the address signal does not exist. In this case, the read signal can not be specified from the memory macro in which the memory cell corresponding to the address signal does not exist. Thus, even if the read out signal from this memory macro is compared with the reference signal, this comparison is meaningless, and it becomes the ineffective signal as the first signal. Hence, an output control signal 334_j may be set such that the first signal 331_j is the effective signal in the case of the existence of the memory cell corresponding to the address signal, and the first signal 331_j is the ineffective signal in the case of the non-existence of the memory cell corresponding to the address signal. Here, the output control signal 334_j is supplied as the selecting signal to a block output selecting unit 315_j of the block testing unit 301_j including a block judging unit 310_j to which the read signal from the j-th memory macro is supplied as the first signal 331_j. Consequently, in the case of the existence of the memory cell corresponding to the address signal, the block judgment result signal 335_j is selected as a test circuit output signal 337_j. In the case of the non-existence of the memory cell corresponding to the address signal, the standard signal RS is selected as the test circuit output signal 337_j. Hence, the comparison result with the existing memory cell is outputted in its original state as the test circuit output signal 337_j. However, in the case of the non-existence of the memory cell corresponding to the address signal, the standard signal RS can be outputted, thereby having no influence on the judgment of the other memory macros. Even if the size structures of the memory macros are various, the verifying tests can be carried out in parallel.

The first logical processing unit 303 in the above-mentioned configuration can be provided with the logical product circuit, the logical sum circuit, the inversion circuits thereof and the like. Also, the individually judging unit 311 can be provided with the exclusive logical sum circuit and the inversion circuit thereof and the like. The second logical processing unit 313 can be provided with the logical sum circuit (OR) of the n-bit input and the inversion circuit (NOR) thereof and like. The block output selecting unit 315 can be provided with the logical sum circuit, the logical product circuit, the inversion circuits thereof, the selector circuit and the like. However actually, the type of the circuit configuration may be suitably selected on the basis of the given signal and the desirable output signal.

Also, this testing circuit 300 can be similarly applied to the case when some memory macros among the plurality of memory macros included in the LSI include a sector that is not targeted for the verification and where the erasing operation and the writing operation are partially inhibited. Concretely, when the address targeted for the verifying test specifies the memory cell in the sector that is not targeted for the verification, the output control signal to be supplied to the block testing unit, to which the read signal from the memory macro including this sector that is not targeted for the verification is supplied, may be set so as to select the standard signal RS as the test circuit output signal of the block testing unit.

The LSI of the present invention in which the above-mentioned configuration of the testing circuit 300 is applied to the verifying circuit will be described below.

Figure 7:
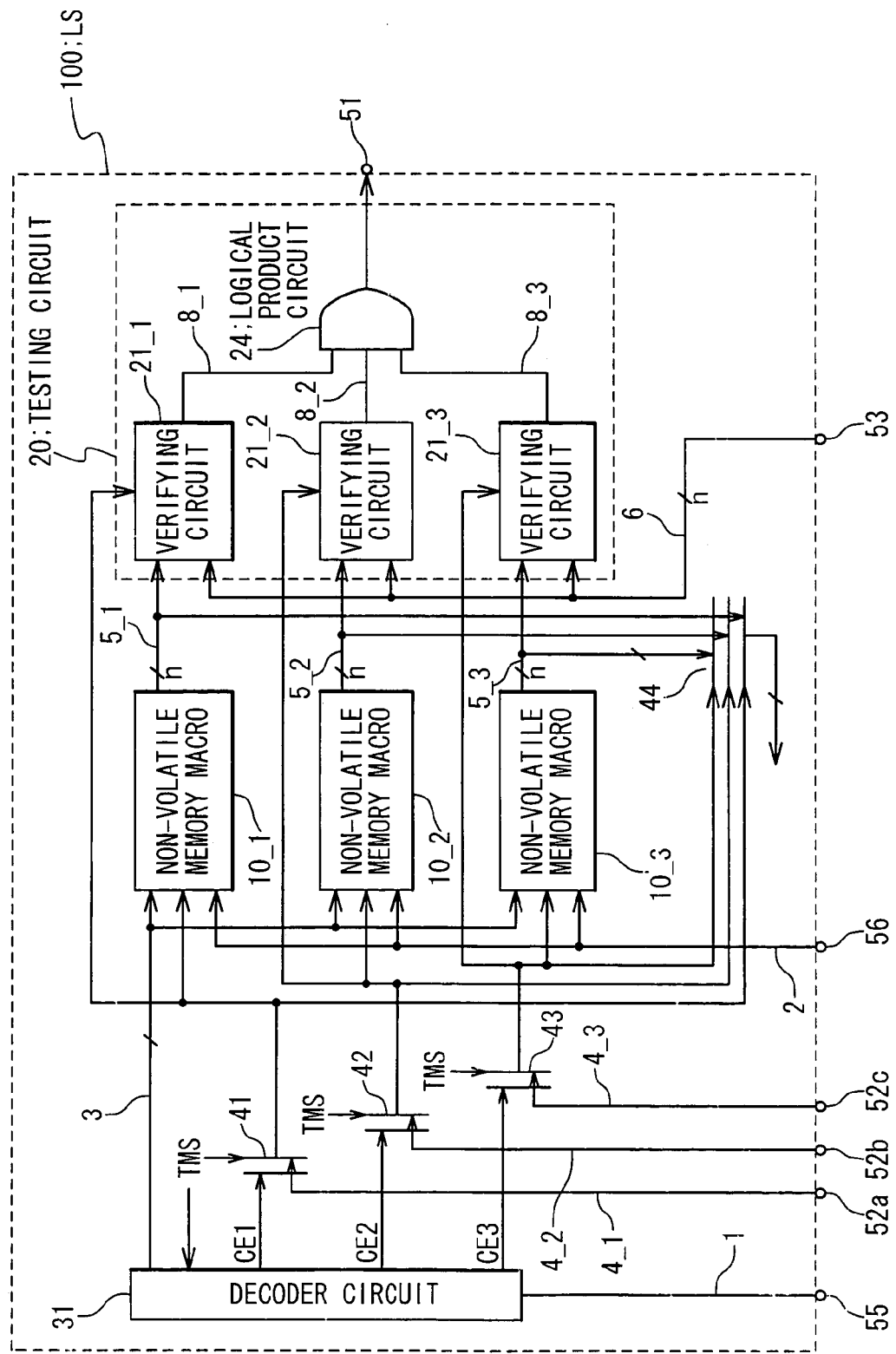
FIG. 7 is a block diagram showing the configuration of this embodiment of the LSI according to the present invention.
Figure 8:
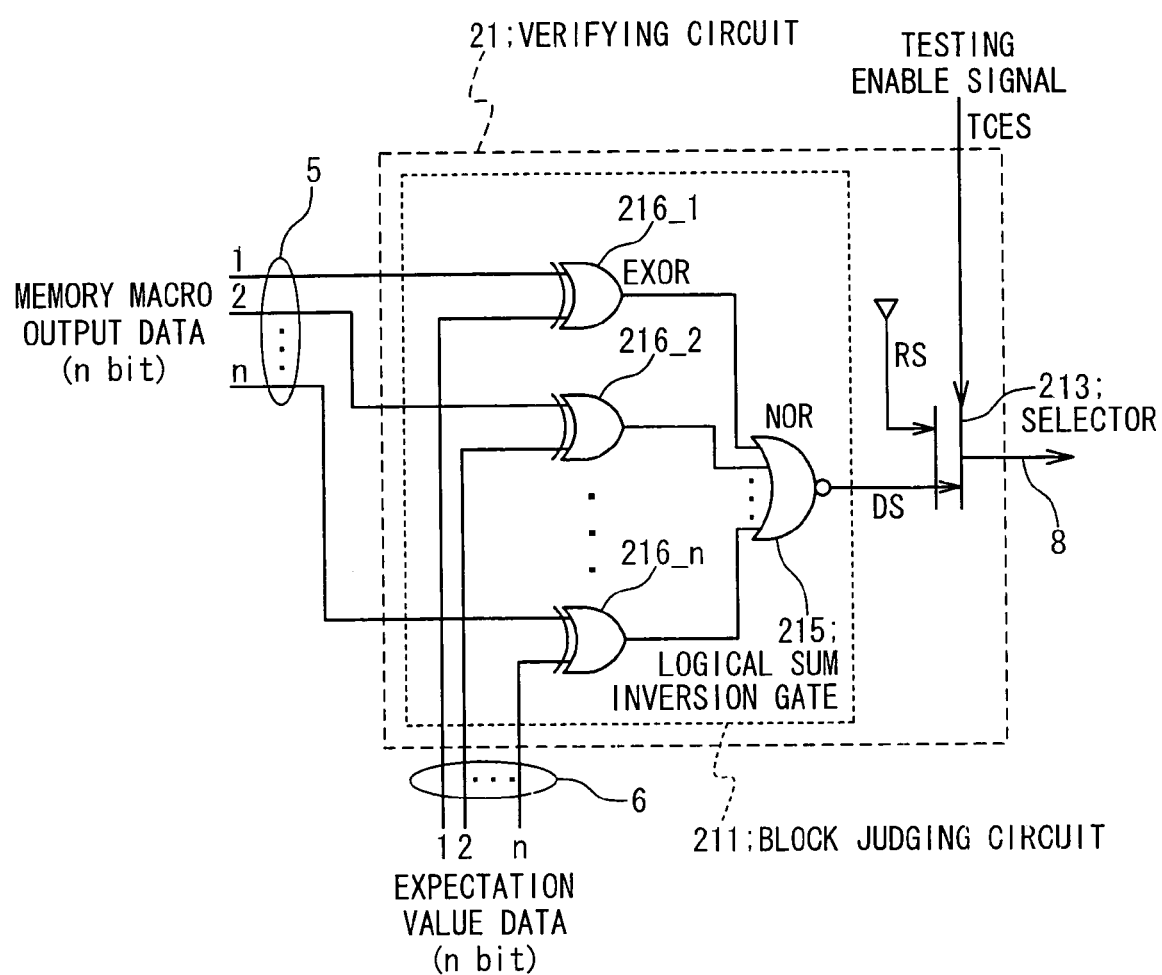
FIG. 8 is a block diagram showing an example of a verifying circuit in FIG. 7.

FIG. 7 is a schematic block diagram showing the configuration of this embodiment of the LSI according to the present invention. FIG. 8 is a block diagram showing an example of a verifying circuit included in this LSI. Here, the case of m=3 will be exemplified below. However, the present invention is not limited to this case. With reference to FIG. 7, a LSI 100 in this embodiment includes three non-volatile memory macros 10_1 to 10_3, a testing circuit 20, a decoder circuit 31 and three selectors 41 to 43. Each of the non-volatile memory macros 10_1 to 10_3 is composed of non-volatile memory cells in which the electrical erasing and writing are possible. The testing circuit 20 serves as a testing unit. The decoder circuit 31 serves as a decoding unit. It receives a test mode signal TMS and a first address signal, decodes them and outputs a second address signal to an address bus 3. Here, the test mode signal TMS becomes active when the test is executed. The first address signal is supplied through an address bus 1 from an address input terminal 55. The decoder circuit 31 outputs first enable signals CE1 to CE3 to corresponding one of the selectors 41 to 43 at the time of the usual operation when the test mode signal TMS is not active. The first enable signals indicate which of the respective memory macros 10_1 to 10_3 is the actual access target. The selectors 41 to 43 receive the test mode signal TMS as the selection signal. They select and output the first enable signals CE1 to CE3 at the time of the usual operation. They select and output the testing enable signals (hereafter, referred to as TCES) 4_1 to 4_3 which are the output control signals received from CE information input terminals 52a, 52b and 52c at the time of the test.

Also, the testing circuit 20 includes three verifying circuits 21_1 to 21_3 and a logical product circuit (hereafter, referred to as an AND gate) 24. The verifying circuits 21_1 to 21_3 respectively corresponding to the memory macros. The AND gate 24 has three input terminal and serves as a totally judging unit which is supplied the signals outputted from the respective verifying circuits 21_1 to 21_3. Then, an output signal of the AND gate 24 is outputted as a verification result judgment signal (referred as VRJS) from a verification result judgment terminal 51.

The output data 5a_1 to 5a_3 are outputted from the respective memory macros 10_1 to 10_3 to the output data buses 5_1 to 5_3, respectively, and supplied to the verifying circuits 21_1 to 21_3. Each of the memory macros 10_1 to 10_3 outputs the output data 5a_1 to 5a_3 of n-bit width (n is an integer of 2 or more) as the read data. The output data buses 5_1 to 5_3 have the n-bit width.

Also, an expectation value data 6 of the n-bit width is used when the memory macros 10_1 to 10_3 are tested. It is supplied to the respective verifying circuits 21_1 to 21_3 from an expectation value data input terminal 53, in parallel. The TCES 4_1 to 4_3 are supplied to the selectors 41 to 43 from the CE information input terminals 52a, 52b and 52c. Further concretely, for example, the first enable signal CE1 and TCES 4_1 are supplied to the selector 41. The first enable signal CE2 and TCES 4_2 are supplied to the selector 42. The first enable signal CE3 and TCES 4_3 are supplied to the selector 43. Then, if the test mode signal TMS serving as the selecting signal is active and indicates a test state, in the selectors 41 to 43, the TCES 4_1 to 4_3 are selected and outputted respectively. Various writing data to the respective memory macros 10_1 to 10_3 are supplied from a data input terminal 56 through a data bus 2.

With reference to FIG. 8, the verifying circuit 21 includes a block judging circuit 211, a selector 213. The block judging circuit 211 serves as a comparing judging unit. It judges whether or not respective bit data of an output data bus 5 of the n-bit width is coincident with respective bit data of an expectation value data 6 of the n-bit width supplied from the expectation value data input terminal 53. Then, it outputs the judgment result as the first judgment signal DS. The selector 213 serves as a first selecting unit. It receives the first judgment signal DS and the predetermined standard signal RS. Then, it selects the first judgment signal DS or the standard signal RS on the basis of the TCES 4 supplied as the selecting signal, and outputs as a second judgment signal 8.

Also, the block judging circuit 211 includes exclusive logical sum gates (hereafter, referred to as EXOR gates) 216_1 to 216_n and a logical sum inversion gate (hereafter, referred to as a NOR gate) 215 with n-input terminal. The EXOR gates 216_1 to 216_n serves as n coincidence judging circuits. The NOR gate 215 serves as a logical circuit for receiving respective output signals of then EXOR gates 216_1 to 216_n, and outputting a judgment result as the first judgment signal DS. Here, the judgment result indicates coincidence judgment result if all of the respective output signals indicate the coincidence, and outputting an inconsistency judgment result if even one of the respective output signals indicates the inconsistency. Here, all of the verifying circuits 21_1 to 21_3 have the configuration of FIG. 8. Thus, the data outputted from the corresponding memory macro 10 is supplied to one input end of the EXOR gates 216_1 to 216_n, and the expectation value data 6 of the n-bit width is supplied to the other input ends, respectively, at the bit correspondence. Also, the standard signal RS is set so as to be the signal corresponding to the same logical value of the first judgment signal DS as the case when the first judgment signal DS outputted from the NOR gate 215 indicates the coincidence.

With reference to FIG. 7, the decoder circuit 31 decodes the first address signal received through the address bus 1 from the address input terminal 55 at the time of the usual operation. Then, it outputs the second address signal to the address bus 3, and also outputs the first enable signals CE1 to CE3 for indicating which of the respective memory macros 10_1 to 10_3 is the actual access target. However, if the test mode signal TMS is active, the first address signal supplied from the address input terminal 55 is outputted in its original state as the second address signal to the address bus 3. At this time, since the first enable signals CE1 to CE3 are not used, any signal may be outputted.

Figures 9A, 9B:
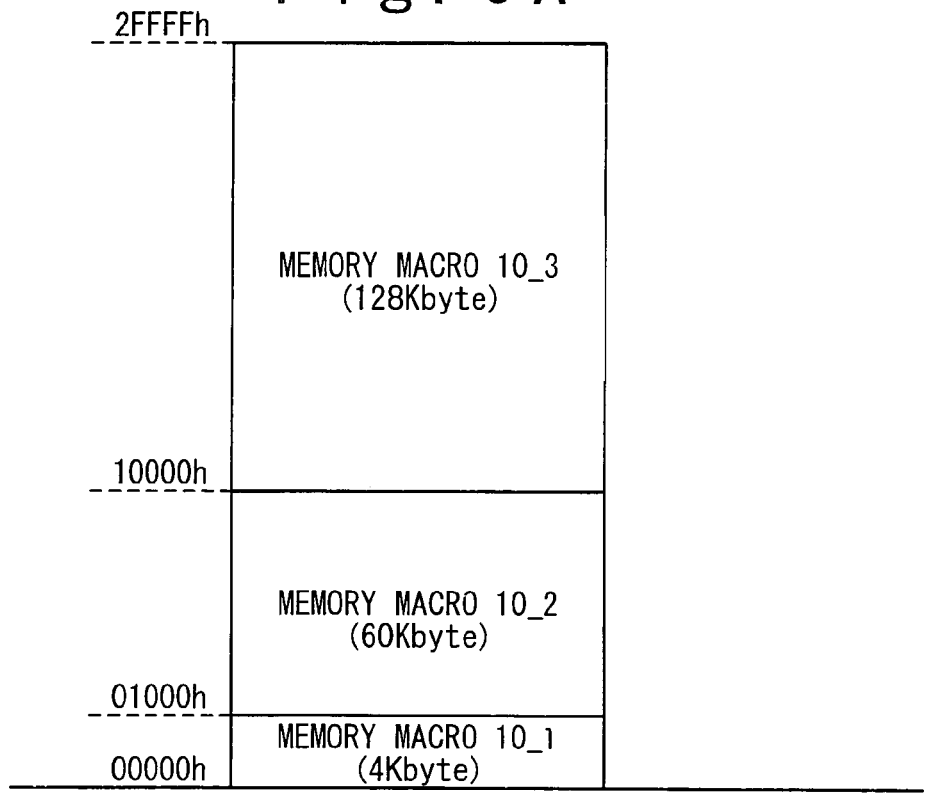
FIGS. 9A and 9B are views showing an example of the address allocation of the memory macros.

Here, the first and second address signals are simply described. FIGS. 9A and 9B are diagrammatic views showing an example of the address allocation of the memory macros 10_1 to 10_3. Even if the plurality of memory macros is built in the LSI such as the LSI 100, it is generally treated that the addresses of those entire memory macros are continuous at the usual operation, especially at the access from the CPU and the like. Consequently, the user can use the memory in the range of the entire memory size of the LSI 100. Thus, the user need not have a concern in the inner structure of the memory. FIG. 9A shows this manner. The numbers of the memory cells (hereafter, merely referred to as the memory size) of the memory macros 10_1 to 10_3 are assumed to be 4 Kbytes, 60 Kbytes and 128 Kbytes, respectively (they are not limited to this assumption). Then, the case in which the addresses are placed in that order is exemplified. However, even if the first address signal in which the entire addresses of the plurality of memory macros are assumed to be continuous is sent in their original states to the respective memory macros, it is impossible to access the desired memory macro. Thus, as shown in FIG. 9B, the address conversion is carried out to the first address signal in order to specify the memory macro and address corresponding to the supplied first address signal, and it need to be sent to the respective memory macros. The first enable signals CE1 to CE3 outputted from the decoder circuit 31 specify the memory macro targeted for the access, and the second address signal outputted to the address bus 3 specifies the access address of the memory macro. On the other hand, at the time of the verifying test, the address signal need to be commonly sent to the respective memory macros. Thus, if the test mode signal TMS is active, the first address signal supplied from the address input terminal 55 is used in its original state as the second address signal and outputted to the address bus 3. Incidentally, a testing address signal input terminal may be separately mounted, and the testing address signal may be directly inputted at the time of the test.

Next, the verifying operation of this LSI 100 will be described below.

Only one verification result output terminal 51 is mounted in this LSI 100. Then, the verification result judgment signal is outputted to the automatically testing apparatus (not shown). The verification result judgment signal becomes "1" if second judgment signals 8_1 to 8_3 outputted by the respective verifying circuits 21_1 to 21_3 are all "1", namely, if each of the second judgment signals 8_1 to 8_3 indicate that the corresponding one of the output data 5a_1 to 5a_3 is coincident with the expectation value data 6.

FIG. 16 is a flowchart showing the operation of a verifying testing method of the present invention for a semiconductor device such as this LSI 100.

When the LSI 100 is tested, the writing verifying test and the erasing verifying test are performed in parallel on the three memory macros 10_1 to 10_3. That is, the same read address is sent from the automatically testing apparatus to the three memory macros 10_1 to 10_3. Each of the verifying circuits 21_1 to 21_3 compares the read data (corresponding one of the output data 5a_1 to 5a_3, first data) outputted from each of the memory macros 10_1 to 10_3 with the expectation value data 6 (reference data) sent to the expectation value data input terminal 53 from the automatically testing apparatus (not shown), for each bit unit at the EXOR gates 216_1 to 216_n (step S01). Then, the verification is carried out in the LSI 100 itself. If there is a bit data that is not coincident with the expectation value data 6, namely, if "1" is outputted from any one of the EXOR gates 216_1 to 216_n, the first judgment signal DS outputted from the NOR gate 215 whose inputs are the outputs from the EXOR gates 216_1 to 216_n becomes "0", namely, the inconsistency (step S02). At this time, if the TCES 4 (output control signal) supplied to the selector 213 which receives the first judgment signal DS of "0" indicates the selection of the first judgment signal DS, the selector 213 outputs the first judgment signal DS of "0" (step S03). Then, the verification result judgment signal (total judgement result signal) outputted from the AND gate 24 becomes "0" (step S04). The comparator of the automatically testing apparatus (not shown) is connected to the verification result output terminal 51. The automatically testing apparatus judges it as the pass if the verification result judgment signal from the testing circuit 20 is "1", and judges it as the failure if "0". If the TCES 4 indicates the selection of the standard signal RS in the step S03, the selector 213 outputs the standard signal RS and the first judgment signal DS is ignored.

Other case occurring in the above operation of a verifying testing method will be readily ascertained by referring to the above-mentioned and following description and drawings.

Figure 1:
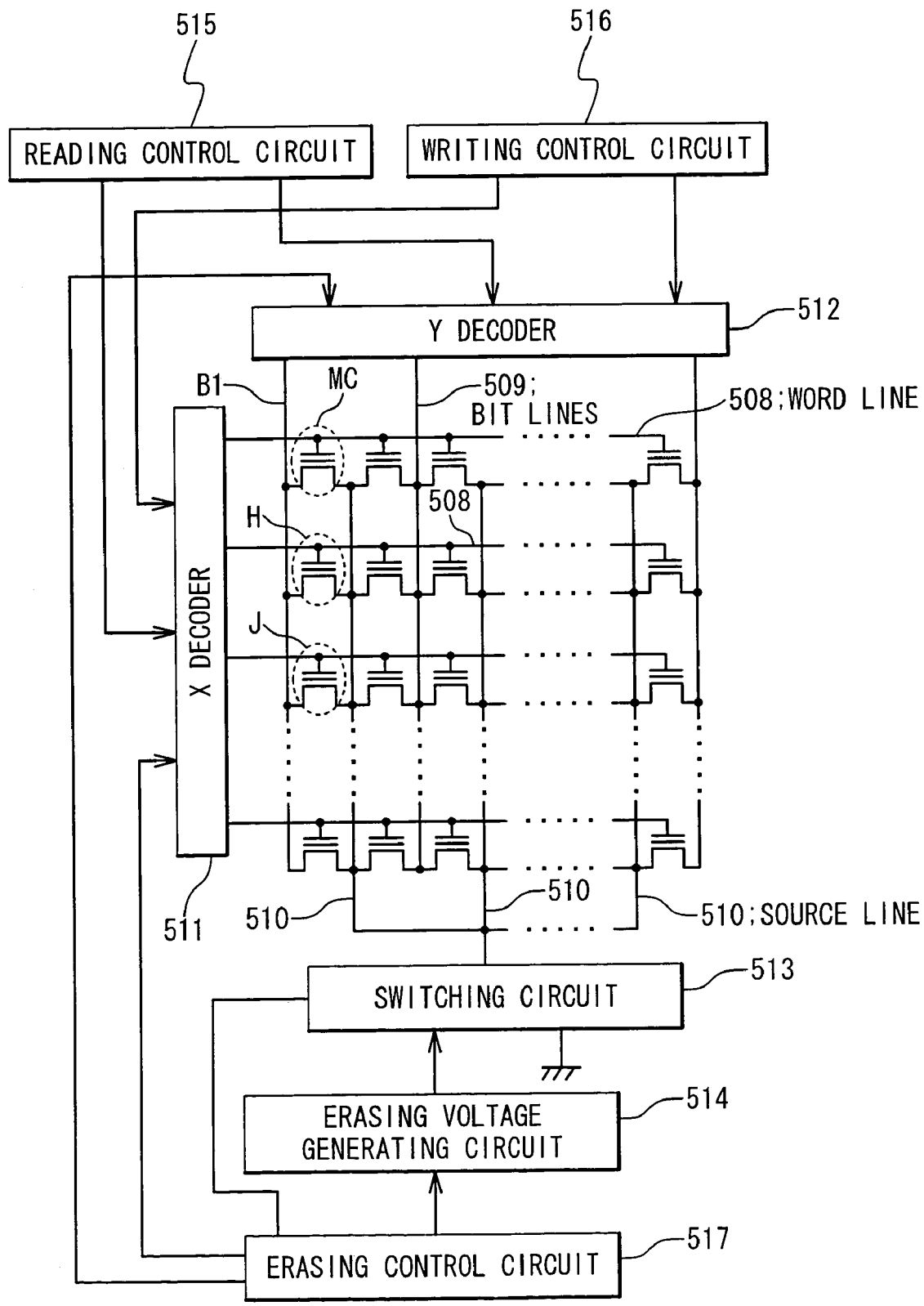
FIG. 1 is a diagram showing the typical example of the configuration of EEPROM of a collectively erasing type.
Figure 2A:
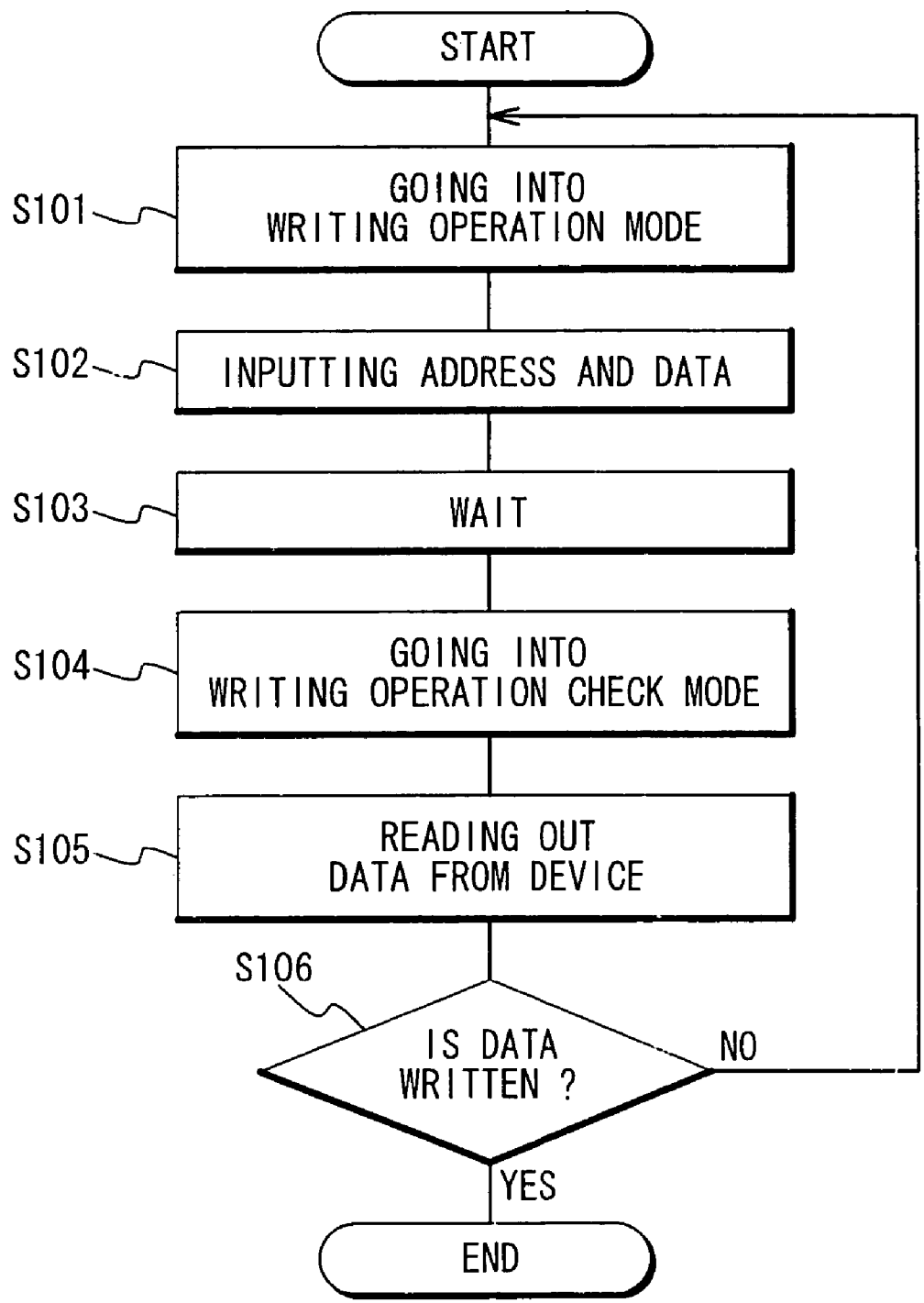
FIG. 2A is a flowchart showing an example of a procedure for a writing verification of the flash memory.
Figure 2B:
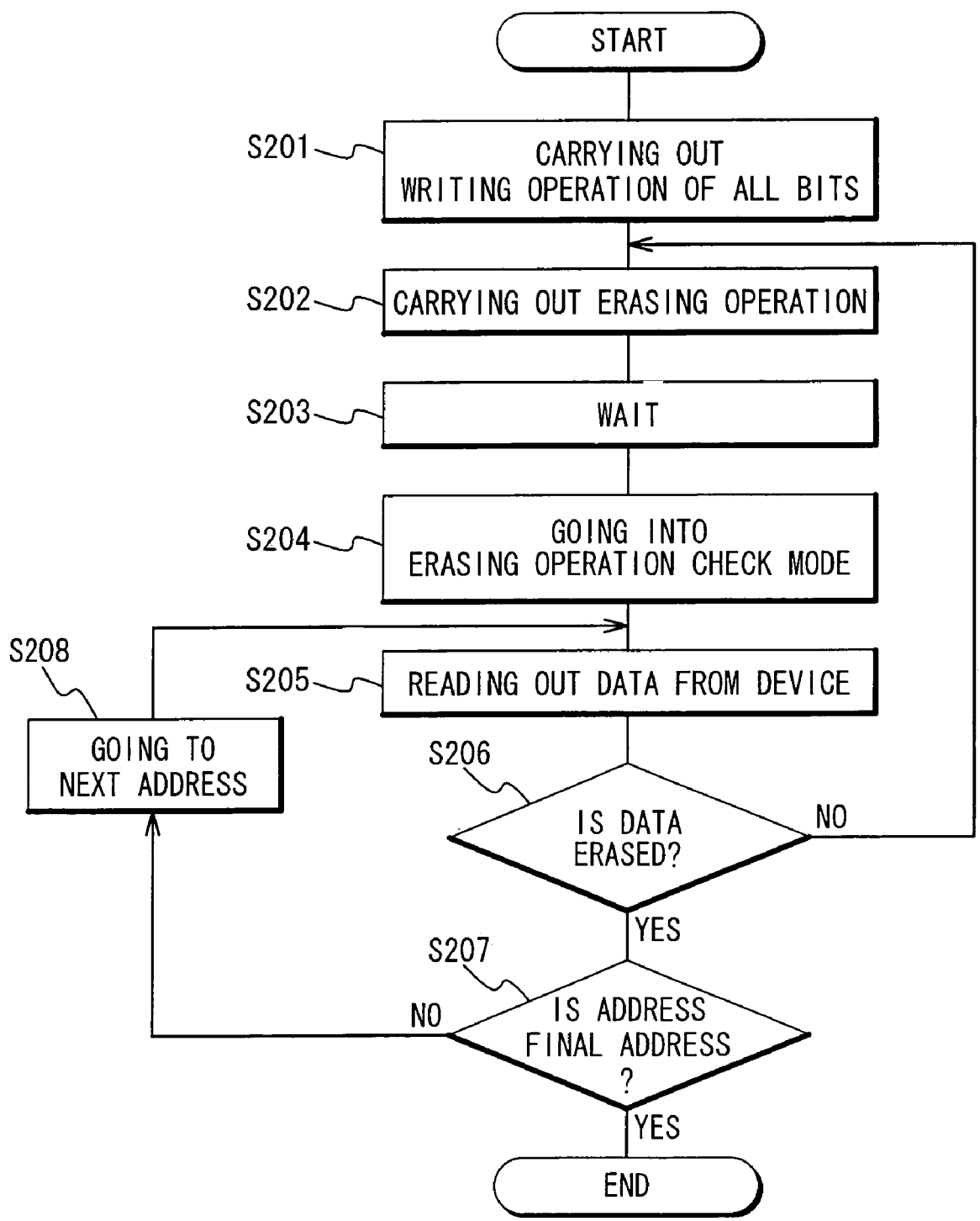
FIG. 2B is flowchart showing an example of a procedure for an erasing verification of the flash memory.
Figure 3:
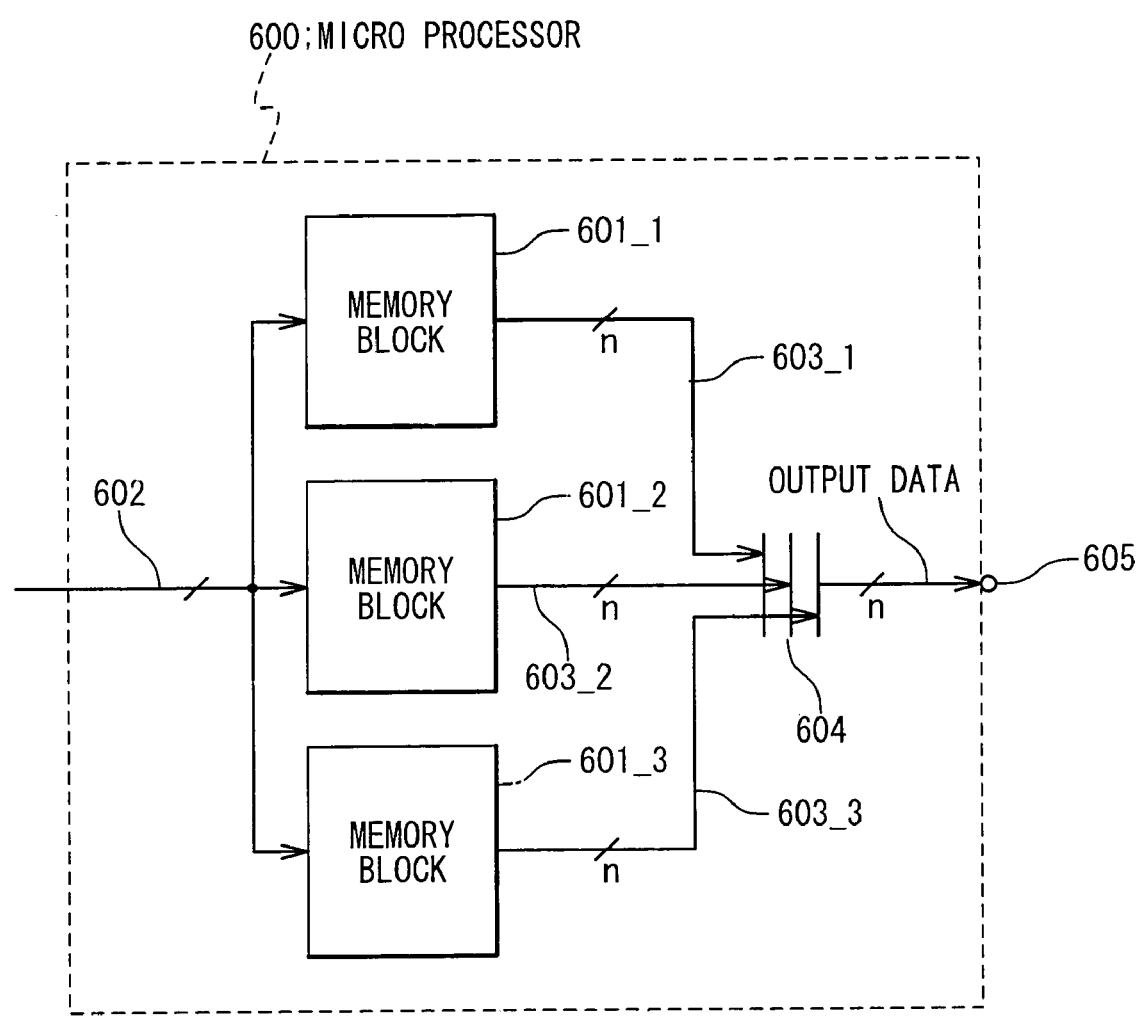
FIG. 3 is a view showing an example of a configuration of a conventional microprocessor.
Figure 4:
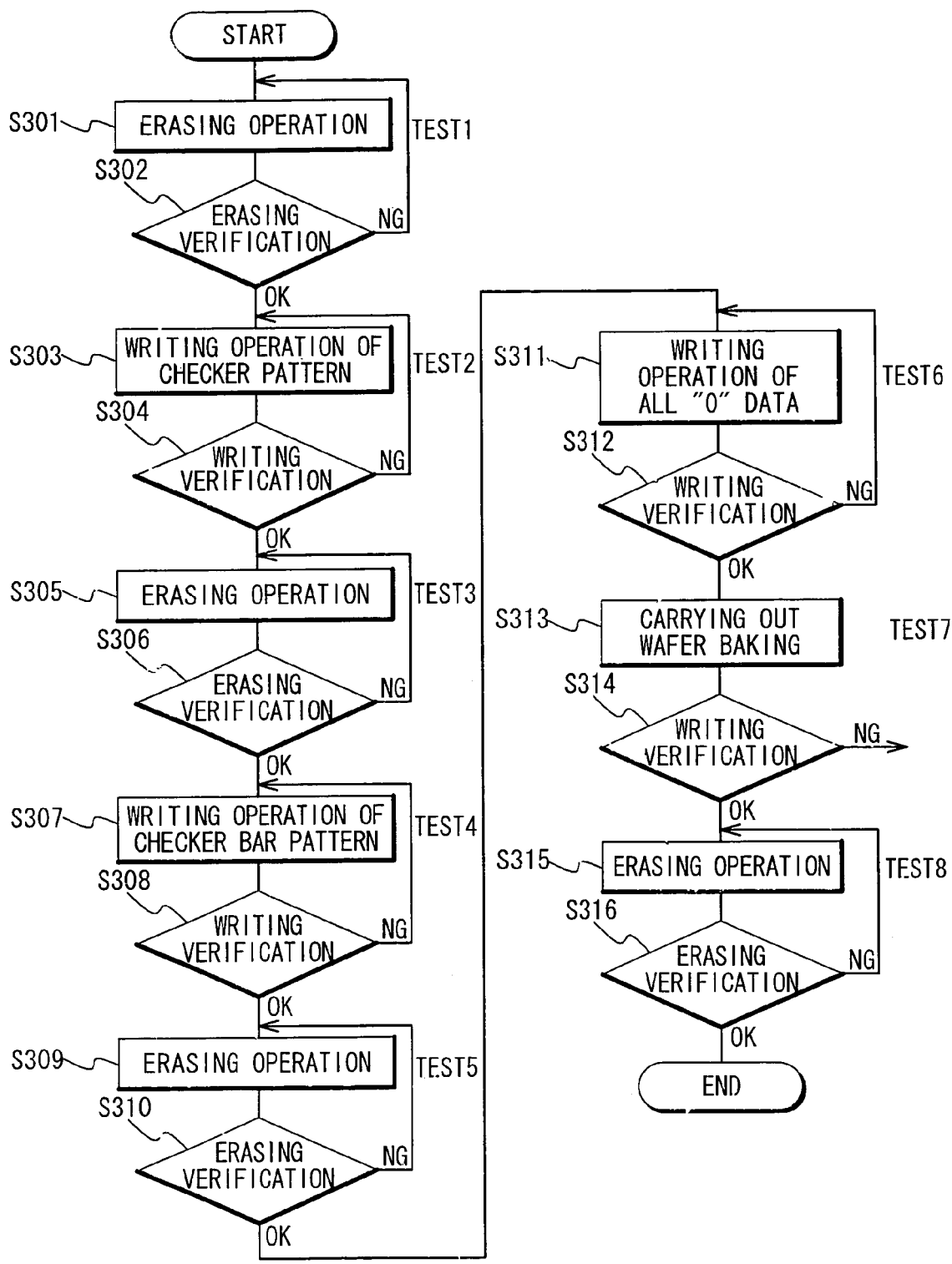
FIG. 4 is a flowchart showing an example of a test sequence usually carried out in the test of the flash memory.
Figure 5A:
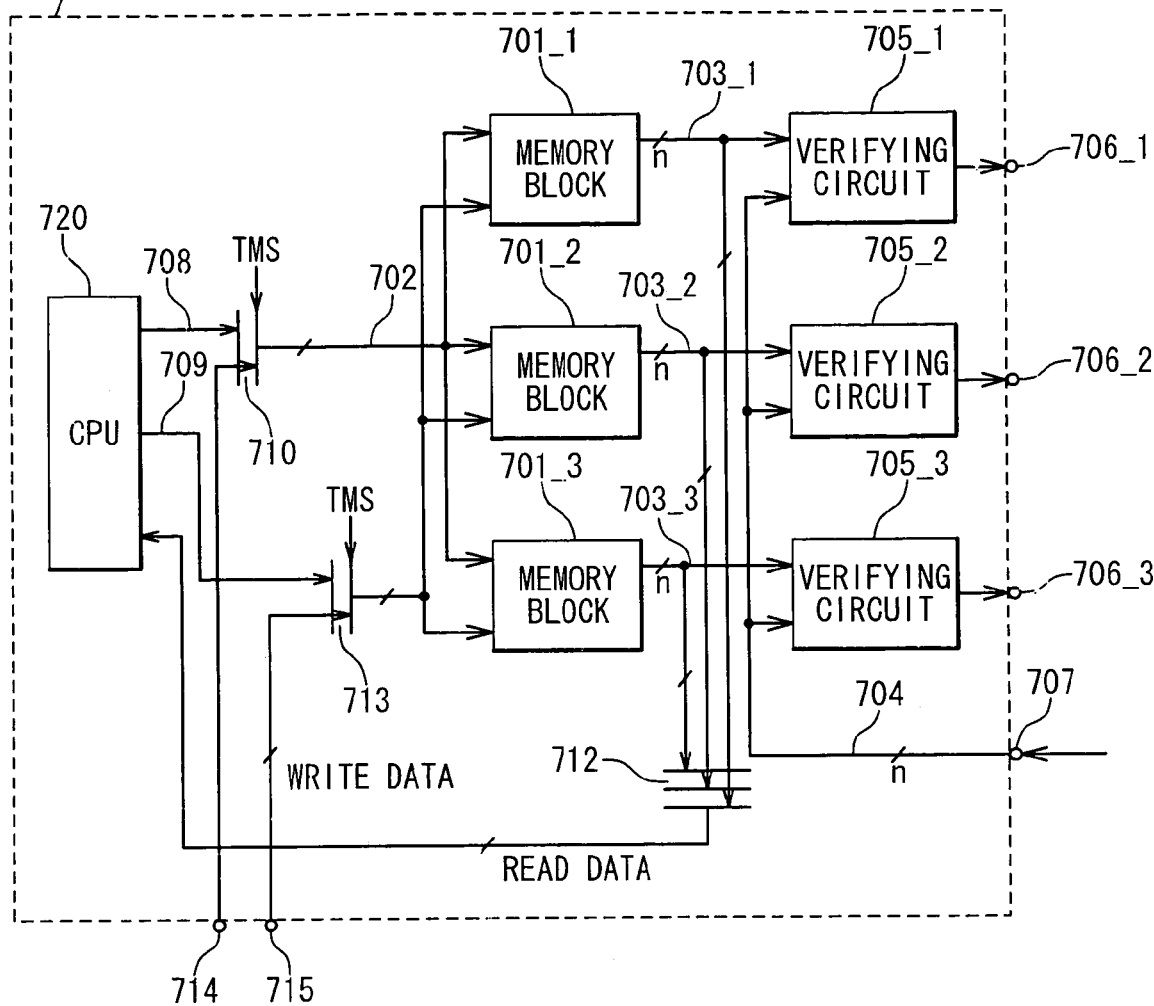
FIG. 5A is a view showing the configuration of one example of the LSI disclosed in the related art.
Figure 5B:
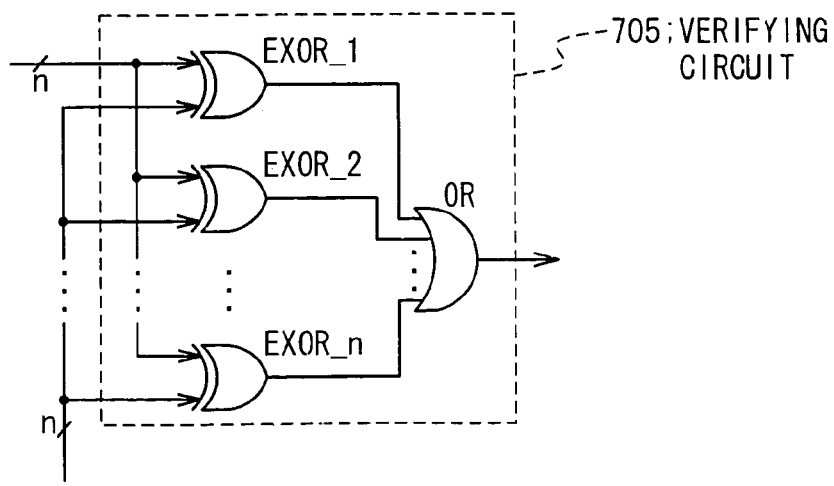
FIG. 5B is a view showing the configuration of the verifying circuits in FIG. 5A.

Here, the TCES 4 is described. In the following explanation, the numbers of the memory cells of the memory macros 10_1 to 10_3 (hereafter, merely referred to as the memory size) are assumed as 4 Kbytes, 60 Kbytes and 128 Kbytes, respectively (they are not to this assumption). FIG. 10A is a view showing the memory sizes of those memory macros 10_1 to 10_3. It shows the final addresses of the respective memory macros 10_1 to 10_3 in a hexadecimal notation. FIG. 10B is a table showing the set state of the TCES 4 based on the verifying test target address. It shows the set example of the TCES 4 for each verification test target address. As shown in FIG. 4B, as for the TCES 4, if there is the memory cell corresponding to the test target address, "1" indicative of the selection of the first judgment signal DS is set. If there is not the memory cell corresponding to the test target address, "0" indicative of the selection of the standard signal RS is set. Concretely, in the range where the test target address is from a "00000" address to a "00FFF" address in the hexadecimal notation (hereafter, represented as [00000h] to [00FFFh]), there are the memory cells corresponding to the respective memory macros 10_1 to 10_3. Thus, TCESes 4_1 to 4_3 are all set to "1". In the range where the test target address is between [01000h] and [0EFFFh], although there is not the corresponding memory cell in the memory macro 10_1, there are the corresponding memory cells in the memory macros 10_2 and 10_3. Thus, the TCES 4_1 is set to "0", and the TCES 4_2 and the TCES 4_3 are both set to "1". In the range where the test target address is between [0F000h] and [1FFFFh], although there is not the corresponding memory cell in the memory macros 10_1 and 10_2, there is the corresponding memory cell in the memory macro 10_3. Thus, the TCES 4_1 and the TCES 4_2 are both set to "0", and the TCES 4_3 is set to "1", respectively. Consequently, when the verifying tests are performed in parallel on the memory macros 10_1 to 10_3, even if the output of the block judging circuit 211 becomes uncertain, the first judgment signal DS is ignored and "1" indicating the coincidence is always outputted as the second judgment signal 8. Hence, the verifying tests are done in parallel without having influence on the judgment result of the other memory blocks. Here, the output of the block judging circuit 211 is for comparing the output of the memory macro 10 in which the memory cell corresponding to the test target address does not exist with the expectation value data. The second judgment signal 8 is the judgment result of the verifying circuit 21.

In this way, even if the single LSI contains the plurality of non-volatile memory macros with different memory sizes, applying of the testing circuit 20 of the present invention enables the verifying tests to be performed in parallel on all the non-volatile memory macros irrespectively of the memory sizes. Thus, the time necessary for the verifying test of the non-volatile memory macros can be made remarkably shorter. Moreover, as the required output terminal dedicated to the LSI test, it is enough to mount the single verification result output terminal. Thus, the number of the output terminals dedicated to the test is greatly reduced. Hence, the number of the comparators necessary for the verifying test of the automatically testing apparatus may be only one. As mentioned above, it is possible to obtain the remarkable effect on the reduction in the test cost and the product cost.

In the LSI 100 of this embodiment, as the input terminal dedicated to the test, the number of the expectation value data input terminals 53 is the number correspondingly to the n bits. The number of the CE information input terminals to receive the TCES 4 is k. Also, the terminals to receive the selecting signal of the test mode and the like are required which will be described later. As a result, the total of the terminals dedicated to the test is k+n+2 at most. Here, k is the number of the CE information input terminals and usually k=m, and n is the bit width of the output data of the memory macro and the number of the expectation value data input terminals. And, 2 is the total value of the verification result output terminal and the control signal terminal dedicated to the test. The number of the terminals dedicated to the test can be naturally reduced over the terminal number of (m+1)×n, which is essential in the case of the circuit configuration to output the data (n bits) of the m memory macros in parallel. Moreover, the number of the terminals dedicated to the test is similar to the case of the Japanese Laid Open Patent Application (JP-A 2001-155500) in which the number of the verification result output terminals is reduced to the number m of the memory macros. Furthermore, in the LSI 100 of this embodiment, even if the memory sizes of the plurality of memory macros are different, those verifying tests can be done in parallel. Therefore, It solves the two subjects of the higher speed of the test and the suppression of the increase in the number of the terminals at the same time.

Also, in the LSI 100, the expectation value data input terminal 53 and the data input terminal 56 are mounted independently of each other. However, since the write data and the expectation value data are usually coincident with each other, they can be used as the single terminal. The number of the terminals dedicated to the test can be further reduced by using the expectation value data input terminal 53 and the data input terminal 56 as the single terminal.

In this embodiment, if the output (the verification result judgment signal) of the testing circuit 20 becomes "0", namely, if the verifying test is failed, the failed memory macro can not be specified. Thus, it is desirable to install the test procedure in the verifying test method to handle the case that the verifying test is failed. The test procedure is for carrying out the test after sequentially switching the TCES 4 so as to output only the first judgment signal DS of the single memory macro 10 as the second judgment signal 8 while fixing the failed read address. Consequently, even if the verifying test is failed, it is possible to easily specify the failed memory macro 10 and its address.

Also, if the writing verification to the memory cell of a certain memory macro is failed (NG) at the test, one of two treatments will be carried out based on the specification of the test such as a property analysis test (a characterization test) or a mass production test. One treatment is that re-writing is immediately carried out to the memory cell. Another treatment is that the failure of the test is recorded on the test program side, and later, the writing operation and the verification are carried out to the failure memory macro.

Figure 11:
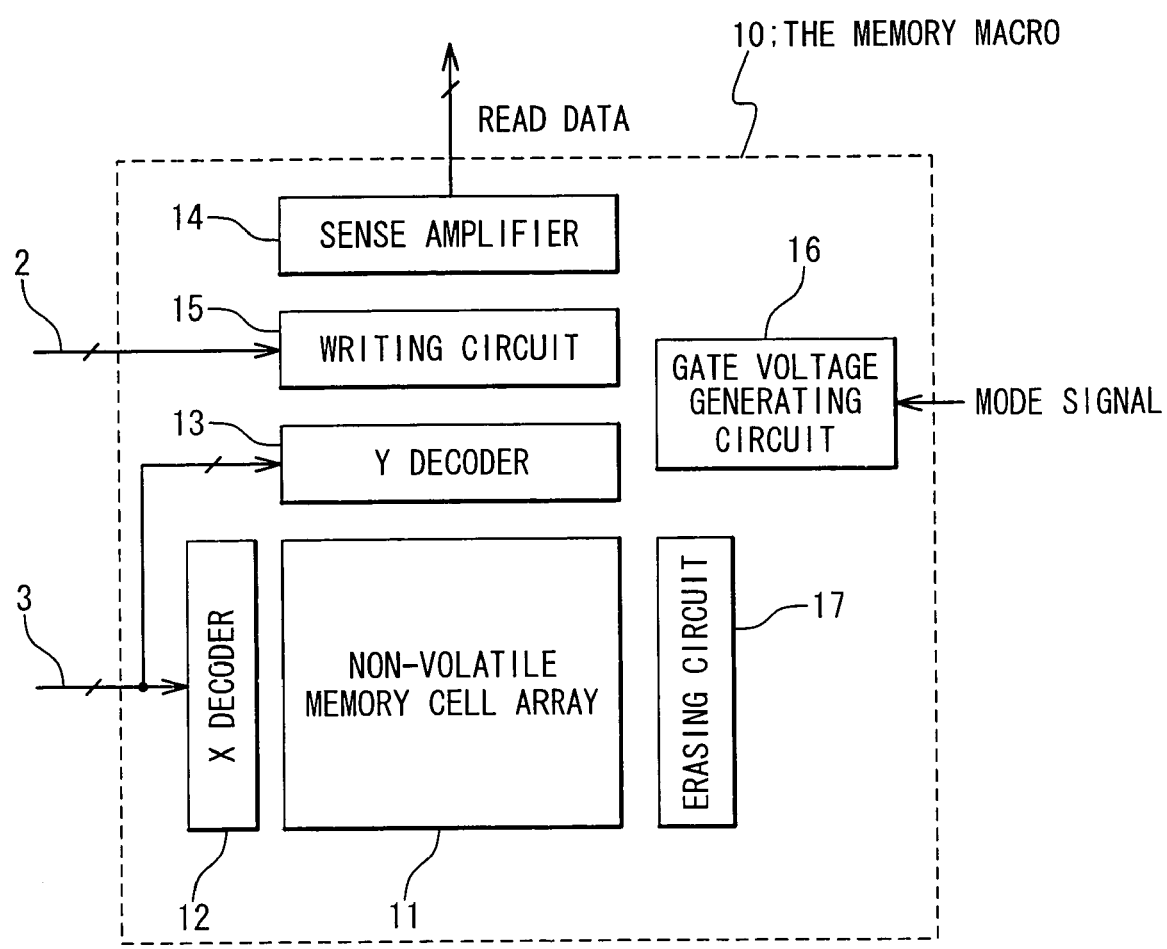
FIG. 11 is a block diagram showing one example of the configuration of the memory macro.

Here, the schematic structure of the memory macro 10 is described. FIG. 11 is a block diagram showing one example of the configuration of the memory macro 10. Since the concrete connection structure inside the memory macro is not directly related to the present invention, the illustration of the connection between blocks is omitted in order to avoid the complexity. With reference to FIG. 11, the memory macro 10 includes a non-volatile memory cell array 11 in which the collective erasing is possible at a memory cell or sector unit, an X decoder 12, a Y decoder 13, a writing circuit 15, a sense amplifier 14, a gate voltage generating circuit 16 and an erasing circuit 17. The size of the memory cell array 11, namely, the memory size may be different for each memory macro.

The gate voltage generating circuit 16 decodes an input mode signal, and generates a gate voltage corresponding to each mode of an erasing mode, an erasing verification mode, a writing mode, a writing verification mode and a reading mode. A voltage of a word line selected by the X decoder 12 is set at the gate voltage generated by the gate voltage generating circuit 16. The erasing circuit 17 switches a common source line of the memory cell array 11 to a high voltage, at the time of the erasing. The writing circuit 15 writes data to the memory cell selected by the X decoder 12 and the Y decoder 13, on the basis of the information of the write data bus. A mode signal supplied to the gate voltage generating circuit 16 may be directly supplied from the side of the automatically testing apparatus or supplied from the other functional macros such as the CPU built in the LSI and the like.

Figure 12A:
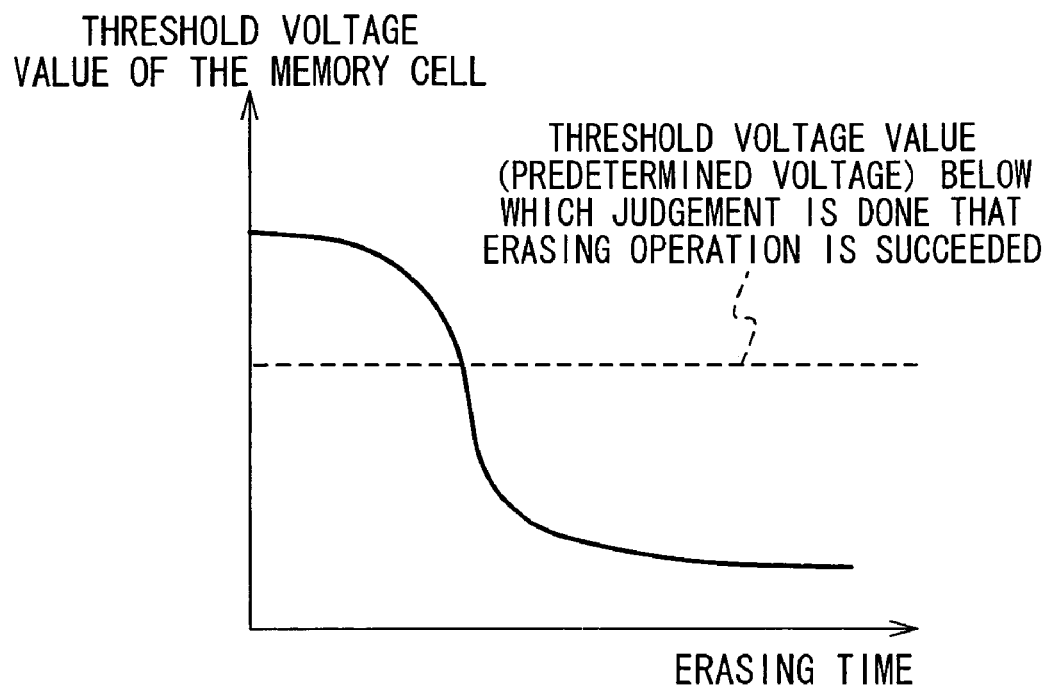
FIG. 12A is a graph showing the erasing verification.
Figure 12B:
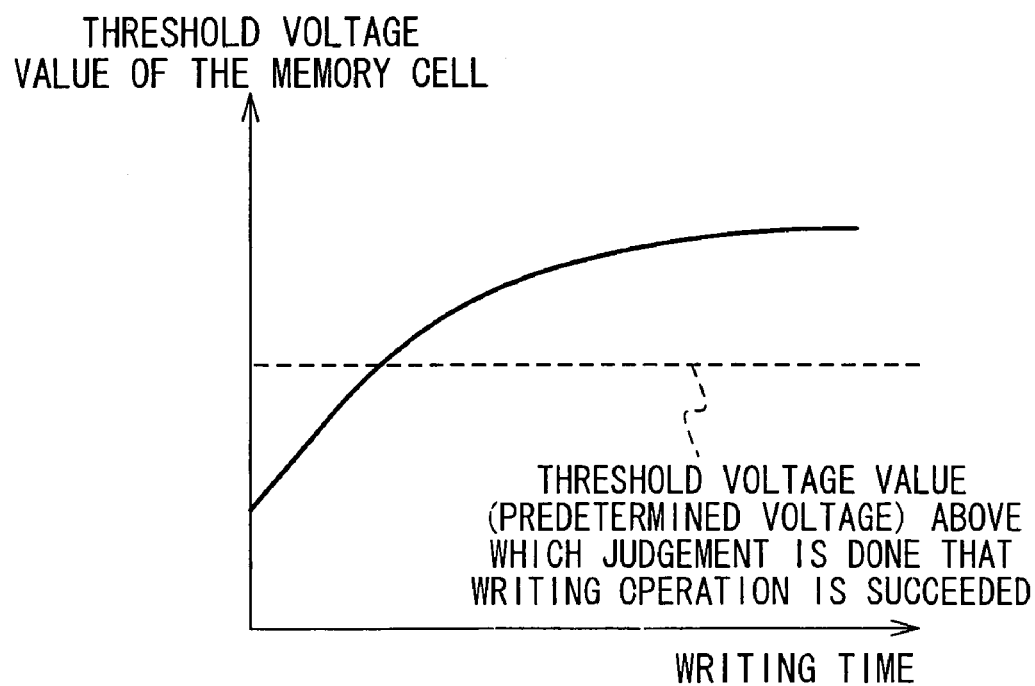
FIG. 12B is a graph showing the writing verification.

The erasing verification and the writing verification in the non-volatile memory will be described below. FIGS. 12A and 12B are graphs showing the erasing verification (FIG. 12A) and the writing verification (FIG. 12B).

With reference to FIG. 11 and FIG. 12A, after the sector unit or all of the memory cells are erased, the gate voltage generated by the gate voltage generating circuit 16 is applied through the word line selected by the X decoder to a control gate of the memory cell. A source line is set at the ground potential, and a bit line selected through the Y decoder is set at a predetermined voltage, thereby reading out a data of selected one memory cell. The current flowing into the bit line connected to the selected memory cell is different on the basis of a threshold voltage value (concretely, a threshold holding voltage value of a memory cell transistor) of the memory cell. If the threshold voltage value of the memory cell becomes lower than the predetermined voltage applied to the control gate, the memory cell transistor is turned on, the current flows into the bit line connected to the selected memory cell, and it is converted into a voltage by the sense amplifier. Thus, "1" or "0" of the data stored in the memory cell is judged based on the voltage. If the threshold voltage value of the memory cell is the gate voltage or less, for example, it is assumed to be "0". If the read data is "0", it is coincident with the expectation value data, and the erasing verification is succeeded. In FIG. 12A, as mentioned above, the respective steps of the erasing and the verification are gradually carried out at a predetermined temporal unit.

Also, with reference to FIG. 12B, in the writing verification, firstly, a high voltage is applied to the gate and the drain of the memory cell selected by specifying the write address, the source is set at the ground potential, and thereby the writing operation is done. After that, the gate voltage generated by the gate voltage generating circuit 16 is applied through the word line selected by the X decoder to the control gate of the memory cell. The source line is set at the ground potential, the bit line selected through the Y decoder is set at a predetermined voltage, and thereby reading out the data of the selected one memory cell. The state when the threshold voltage value of the memory cell exceeds the gate voltage is assumed to be "1". Then, if the read out data is "1", the writing verification is successful.

A first example, in which the present invention is applied to the LSI including therein the CPU and the plurality of non-volatile memory macros, namely, a so-called micro computer will be described below. In the following explanation of the first example, the same reference symbols are given to the same components as the above-mentioned embodiment, and their detailed explanations are omitted.

Figure 13:
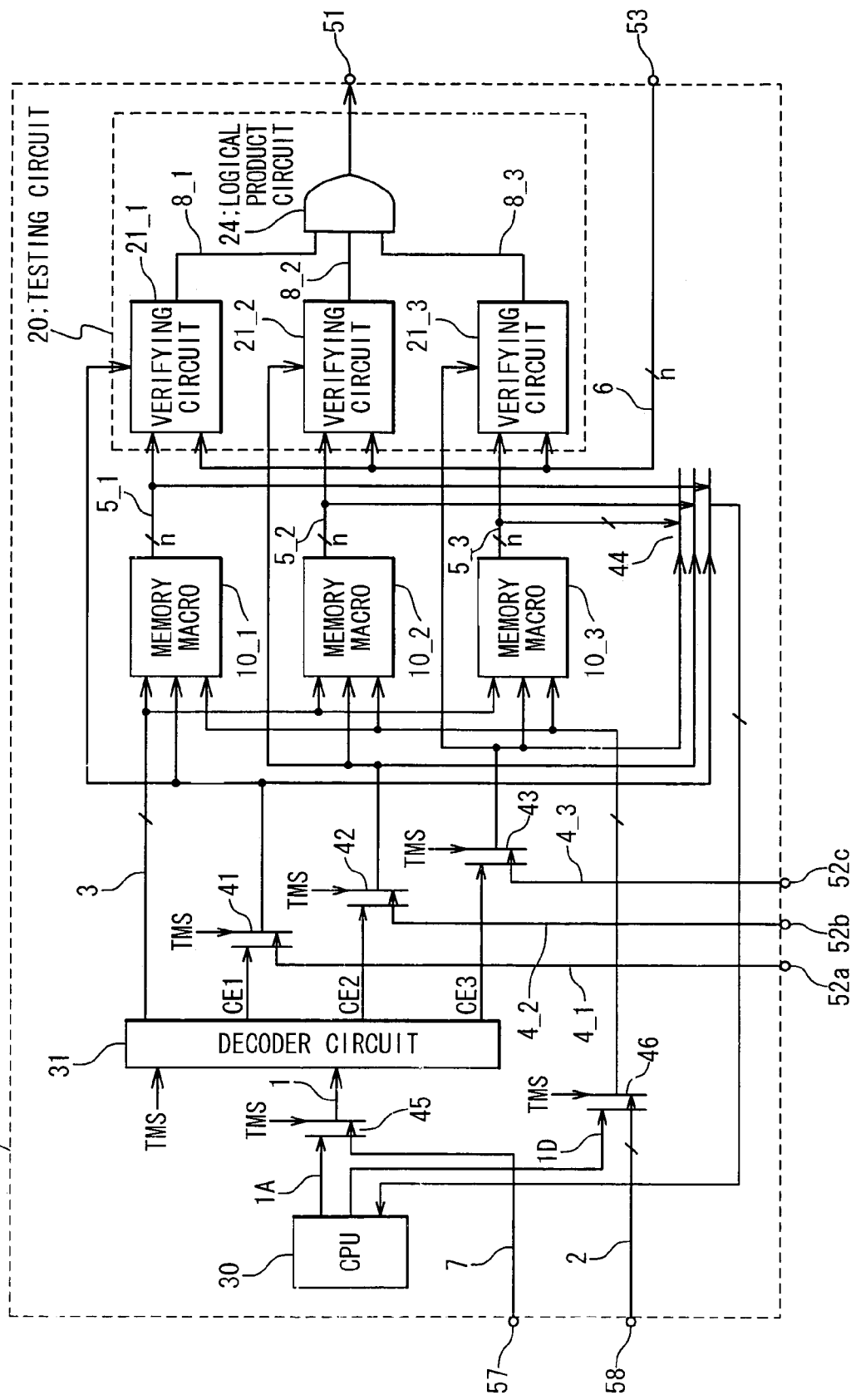
FIG. 13 is a view showing the schematic configuration of the micro computer of the first example of the present invention.

FIG. 13 is a view showing the schematic configuration of the micro computer of the first example of the present invention. With reference to FIG. 13, an LSI 100A that is the micro computer includes a CPU 30, a selector 45, a selector 46, a decoder circuit 31, selectors 41 to 43, a plurality of memory macros 10_1 to 10_3, a selector 44 and the testing circuit 20.

The selector 45 serves as a third selecting unit. It receives a CPU address signal outputted from the CPU 30 to an address bus 1A and a testing address signal sent to the testing address input terminal 57 from the automatically testing apparatus (not shown) at the time of the test. Then, it selects the CPU address signal at the time of the usual operation, and selects the testing address signal sent to the testing address input terminal 57 at the time of the test, based on the test mode signal TMS as the selection signal. After that, it outputs one of the CPU address signal and the testing address signal as a first address signal to an address bus 1.

The selector 46 serves as a fifth selecting unit. It receives a data signal outputted from the CPU 30 to a data bus 1D and a data signal sent to the testing data input terminal 58 from the automatically testing apparatus at the time of the test. Then, it selectively outputs the data signal from the CPU 30 at the time of the usual operation, and selectively outputs the data signal from the testing data input terminal 58 at the time of the test, based on the test mode signal TMS as the selection signal.

The decoder circuit 31 decodes the address signal inputted from the address bus 1, outputs the address signal to the address bus 3, and outputs the first enable signals CE1 to CE3 to indicate which of the respective memory macros 10_1 to 10_3 is the actual access target.

The selectors 41 to 43 receive the first enable signals CE1 to CE3 and the TCESes 4_1 to 4_3 supplied from the CE information input terminals 52a, 52b and 52c, respectively. They also receive the test mode signal TMS as the selecting signal. Then, they selectively output the first enable signals CE1 to CE3 at the time of the usual operation at which the test mode signal TMS is not active. They also selectively output the TCESes 4_1 to 4_3 at the time of the test at which the test mode signal TMS is active.

The plurality of memory macros 10_1 to 10_3 receives the address signal and the data signal outputted from the selector 45 and the selector 46, respectively, at the address terminal and the data terminal.

The selector 44 serves as a fourth selecting unit. It receives the output data 5a_1 to 5a_3 of the n-bit width that are outputted to the output data buses 5_1 to 5_3 from the plurality of memory macros 10_1 to 10_3. It selectively outputs the output data, on the basis of the memory macro accessed in the CPU 30 at the time of the usual operation, and then sends to the CPU 30.

The testing circuit 20 carries out the erasing verifying test and the writing verifying test of the memory macros 10_1 to 10_3.

Also, the testing circuit 20 includes the three verifying circuits 21_1 to 21_3 corresponding to the respective memory macros; and the 3-input AND gate 24 whose inputs are the signals outputted from the respective verifying circuits 21_1 to 21_3. The output signal of the AND gate 24 is outputted as the verification result judgment signal (VRJS) from the verification result output terminal 51.

The outputs from the respective memory macros 10_1 to 10_3 are outputted to the output data buses 5_1 to 5_3, respectively, and supplied to the verifying circuits 21_1 to 21_3. The data of the n-bit width (n is an integer of 2 or more) are outputted as the read data from the respective memory macros 10_1 to 10_3, and the output data buses 5_1 to 5_3 have the n-bit width. Even in this micro computer 100A, only one verification result output terminal 51 is mounted irrespectively of the number of the built-in memory macros.

The testing data input terminal 58 receives the write data, such as a checker (CHECKER) pattern, a checker bar pattern (the inversion of the checker pattern), all "0" pattern and the like from the automatically testing apparatus (not shown). At the time of the verifying test, the CPU 30 may set the output to the data bus 1D in an inhibition state, and the selector 44 may not output the data (a high impedance state) or the input of CPU 30 may be masked not to receives the read data. Also, the control signal for setting to the memory macros 10_1 to 10_3 from the CPU 30 may include the mode signal, and the mode signal sent to the gate voltage generating circuit 16 is set through the CPU 30.

Next, the operation of the verifying test of the micro computer 100A will be described below with reference to FIG. 13. At the time of the verifying test, the test mode signal TMS from the automatically testing apparatus (not shown) is made active, and the address signal targeted for the verification is supplied to the testing address input terminal 57. The selector 45 selectively outputs the address signal received from the testing address input terminal 57 to the address bus 1. The address signal outputted from the selector 45 is further decoded by the decoder circuit 31 and then outputted to the address bus 3. The first enable signals CE1 to CE3 are outputted, and the address signal is simultaneously sent to the plurality of memory macros 10_1 to 10_3.

The memory macros 10_1 to 10_3 output the read data of the memory cell of the address corresponding to the supplied address signal, to the output data buses 5_1 to 5_3, respectively. Since the test mode signal TMS that is the selection signal is active, the selectors 41 to 43 selects and outputs the TCESes 4_1 to 4_3.

The respective verifying circuits 21_1 to 21_3 judge whether or not the bit data on the output data buses 5_1 to 5_3 coincide with the bit data of the expectation value data 6 sent to the expectation value data input terminal 53 from the driver of the automatically testing apparatus (not shown). Then, if all of the bits are coincident, the output of the NOR gate 215 that is the first judgment signal DS of the block judging circuit 211 becomes "1". If the inconsistence is detected in even one bit, the output of the NOR gate 215 becomes "0". Then, on the basis of the TCESes 4_1 to 4_3 outputted through the selectors 41 to 43, the verifying circuit 21, which receives the output data of the memory macro 10 where there is the memory cell corresponding to the address on which the verifying test is performed, outputs the first judgment signal DS of the block judging circuit 211 included in the verifying circuit 21 as the second judgment signal 8. The verifying circuit 21, which receives the output data of the memory macro 10 where there is not the memory cell corresponding to the address, outputs the standard signal RS as the second judgment signal 8. The AND gate 24 outputs "0" from the verification result output terminal 51, if "0" is included even in one of the second judgment signals 8_1 to 8_3, and then reports the failure to the automatically testing apparatus.

As mentioned above, the TCES 4 selects whether the output signal of the verifying circuit 21 is defined as the first judgment signal DS or the standard signal RS. Thus, the case when "0" is outputted as the second judgment signal 8 is only the case that the data read out from the existing memory cell is not coincident with the expectation value data. Hence, even if the memory sizes of the memory macros 10_1 to 10_3 are not coincident, the verifying tests can be done in parallel at the same time. Moreover, the number of the verification result output terminals dedicated to the test might be only one.

In this way, according to the first example of the present invention, even if the plurality of memory macros include the memory macro whose memory size is different, it is possible to shorten the time of the verifying tests for the plurality of memory macros. Also, it is possible to suppress and reduce the increase in the number of the terminals for the test.

Incidentally, even in the LSI 100A of the first example, although the expectation value data input terminal 53 and the testing data input terminal 58 are mounted independently of each other, they can be used as the single terminal, similarly to the case of the LSI 100. Also, in this case, the number of the terminals dedicated to the test can be further reduced by using the expectation value data input terminal 53 and the testing data input terminal 58 as the single terminal.

Figure 14:
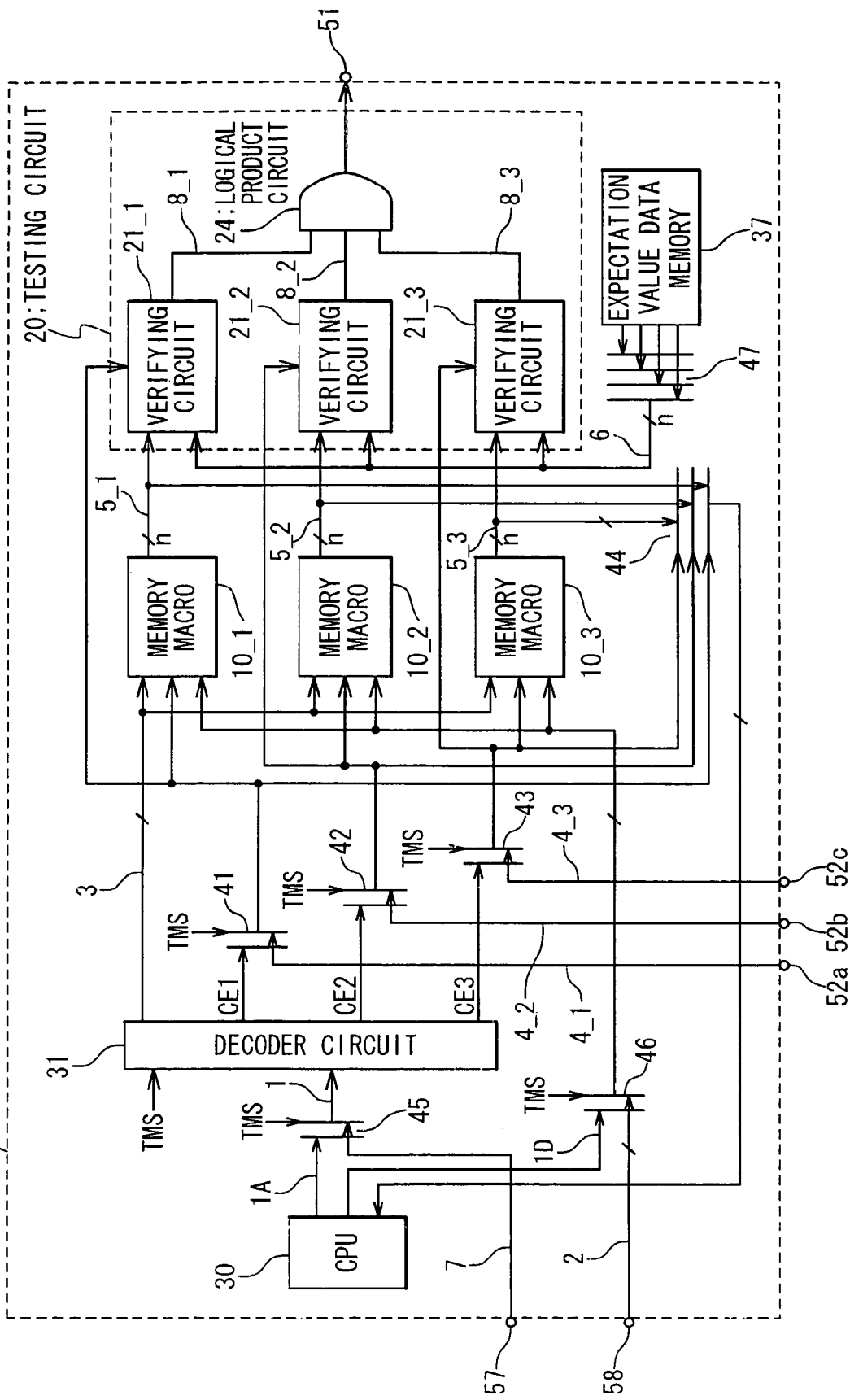
FIG. 14 is a view showing the configuration of the second example according to the present invention.

A second example of the present invention will be described below. FIG. 14 is a view showing the configuration of the second example according to the present invention. With reference to FIG. 14, the second example is different in the following configuration from the first example. That is, the expectation value data is preliminarily stored and held in an expectation value data memory 37 built in a LSI 100B that is a micro computer. A selector 47 selectively outputs the expectation value data read out from the expectation value data memory 37, on the basis of the type of the verifying test to be executed. Then, the selectively-outputted expectation value data 6 is sent to the EXOR gates of the verifying circuits 21_1 to 21_3 of the respective memory macros 10_1 to 10_3. The expectation value data memory 37 built in the LSI may be EEPROM, a mask ROM and the like.

The expectation value data memory 37 preliminarily stores the expectation value pattern (a column size corresponds to a bit width of an output data of the memory macro) corresponding to the erasing verification, the all "0" write verification, the checker write verification and the checker bar write verification. Then, a selector 47 selects the expectation value data corresponding to the verifying test, on the basis of a mode signal sent from the automatically testing apparatus (not shown), and sends to the verifying circuits 21_1 to 21_3.

Even in the second example, the verifying circuits 21_1 to 21_3 have the same configuration as the explanation in the first example. Thus, its explanation is omitted.

Figure 15:
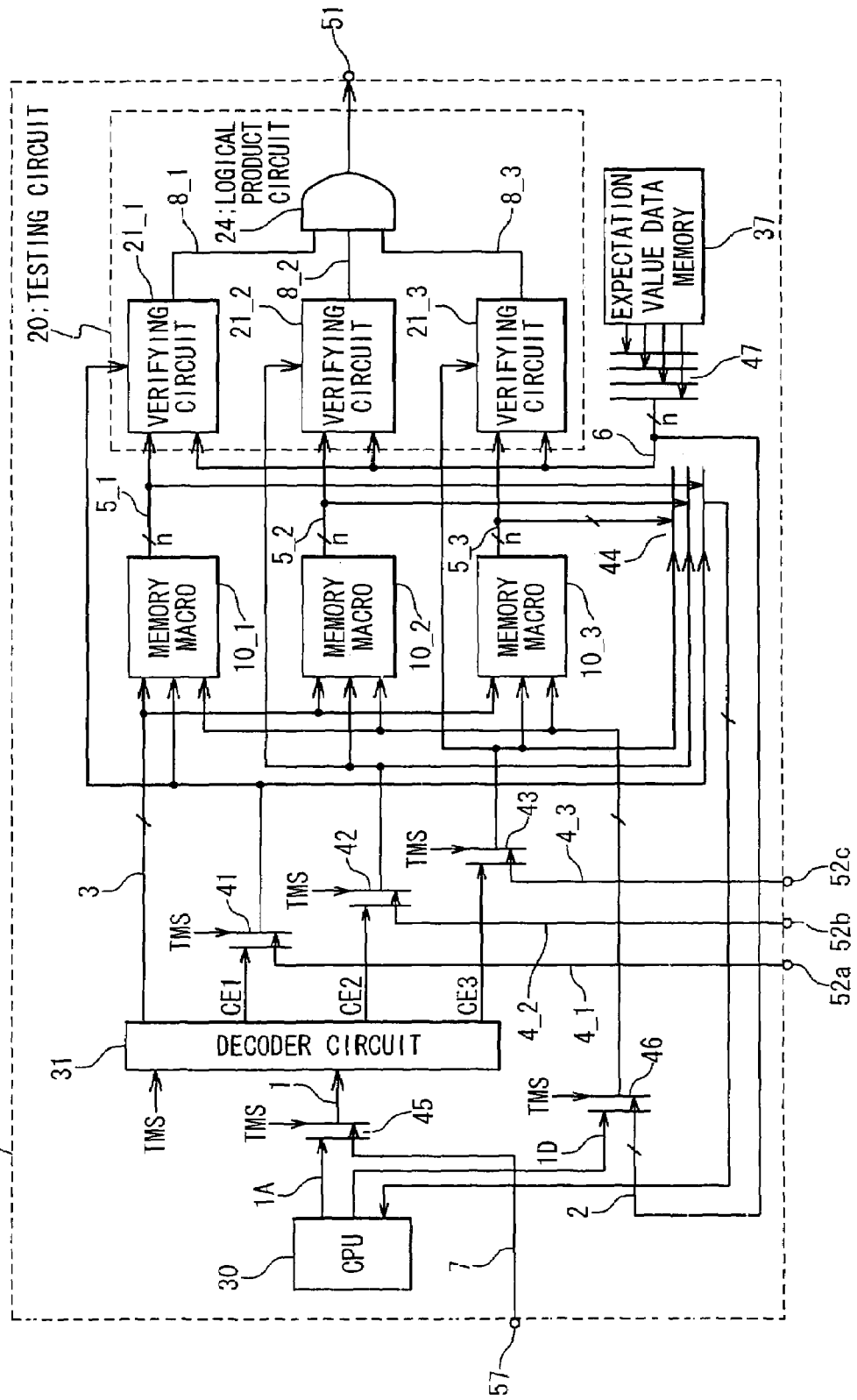
FIG. 15 is a view showing another configuration of the second example according to the present invention.

FIG. 15 is a view showing another configuration of the second example according to the present invention. In this LSI 100C in FIG. 14, the testing data input terminal 58 is mounted. However, as shown in FIG. 15, if the expectation value data 6 outputted from the selector 47 is inputted through the data bus 2 to the selector 46, the testing data input terminal 58 can be removed, thereby reducing the number of the terminals dedicated to the test.

The second example does not require the expectation value data input terminal 53 mounted in the first example. Thus, this reduces the number of the terminals dedicated to the test in the LSI, and does not require the preparation for the expectation value pattern for the verifying test, in the automatically testing apparatus. Hence, the labor for the pattern preparation can be omitted, thereby making the test easier.

The above-mentioned embodiments and the respective examples have been described by exemplifying the memory macro having the structure in which the data input output is the multiple-bit. Of course, they can be similarly applied to the configuration having a plurality of memory macros in which the input and output of data are one-bit structure. In this case, the expectation value data 6 supplied from the expectation value data input terminal 53 in FIG. 7 and FIG.13 is the data of one-bit width.

As mentioned above, according to the present invention, for example, in the LSI having the plurality of non-volatile memory macros in which the electrical erasing and writing are possible, even if there is the sector that includes the macros whose memory sizes are different or includes some macros in which the erasing and the writing are partially inhibited, while the increase in the number of the terminals dedicated to the test is suppressed, the verifying tests for the plurality of memory macros can be executed in parallel, thereby providing the effect of making the test efficient.

Also, according to the present invention, since the expectation value data is preliminarily stored in the LSI, the pattern preparation and the terminal dedicated to receive the expectation value data for the verifying test are not required, thereby making the test further efficient.

Moreover, according to the present invention, since the circuit for judging the verification result is installed in the LSI, the number of the comparators necessary in the automatically testing apparatus can be reduced, and the test can be made easier.

What is claimed is:

1. A testing circuit comprising:
   m (m is an integer of 2 or more) block test units, each of which compares a first data of n (n is a positive integer) bits with a reference data of said n bits for each corresponding bit, and outputs a comparison result as a test circuit output signal based on a output control signal, wherein said first data is outputted from corresponding one of m object circuits for a test; and
   a first logical processing unit which judges whether or not said all of m said test circuit output signals indicate that said first data is coincident with said reference data, and outputs a judgment result as a total judgment result signal based on said m test circuit output signals,
   wherein each of said m block test units includes:
   a block judging unit which compares said first data with said reference data for each corresponding bit to judge whether said first data is coincident with said reference data, and outputs a comparison result as a block judgment result signal, and
   a block output selecting unit which outputs one of said block judgment result signal and a predetermined standard signal as said test circuit output signal, wherein a determination which one of said block judgment result signal and said predetermined standard signal to use as said test circuit output signal is based on said output control signal.

2. The testing circuit according to claim 1, wherein said total judgment result signal indicates all of said m object circuits pass said test, in case that all of m said test circuit output signal indicate that said first data is coincident with said reference data.

3. The testing circuit according to claim 1, wherein said total judgment result signal indicates at least one of said m object circuits fails said test, in case that at least one of m said test circuit output signal indicates that said first data is not coincident with said reference data.

4. The testing circuit according to claim 1, wherein said block judging unit includes:

n individually judging units, each of which compares one of n bits of said first data with corresponding one of n bits of said reference data, and outputs a comparison result as a comparison result signal, and a second logical processing unit which outputs said block judgment result signal indicating whether or not said first data is coincident with said reference data, based on a plurality of said comparison result signals supplied from said n individually judging units.

5. The testing circuit according to claim 4, wherein said block judgment result signal indicates that said first data is coincident with said reference data, in case that all of said comparison result signals indicate that said one of n bits of the first data is coincident with said corresponding one of n bits of the reference data.

6. A testing circuit comprising:

m (m is an integer of 2 or more) block test units, each of which compares a first data of n (n is a positive integer) bits with a reference data of said n bits for each corresponding bit, and outputs a comparison result as a test circuit output signal based on a output control signal, wherein said first data is outputted from corresponding one of m object circuits for a test; and a first logical processing unit which judges whether or not said all of m said test circuit output signals indicate that said first data is coincident with said reference data, and outputs a judgment result as a total judgment result signal based on said m test circuit output signals, wherein each of said m block test units includes:

a block judging unit which compares said first data with said reference data for each corresponding bit to judge whether said first data is coincident with said reference data, and outputs a comparison result as a block judgment result signal, and a block output selecting unit which outputs one of said block judgment result signal and a predetermined standard signal as said test circuit output signal based on said output control signal, and wherein said output control signal is set such that said block output selecting unit outputs one of said block judgment result signal and said standard signal, in reference to a test condition for said one of m object circuits when said first data is outputted.

7. The testing circuit according to claim 6, wherein said block output selecting unit outputs said block judgment result signal when said test condition corresponds to said one of m object circuits, and outputs said standard signal when test condition does not correspond to said one of m object circuits, based on said output control signal.

8. The testing circuit according to claim 6, wherein said standard signal is set as the same logical state of said block judgment result signal indicating that said first data is coincident with said reference data.

\* \* \* \* \*